United States Patent [19]

Quate et al.

[11] Patent Number: 5,317,533
[45] Date of Patent: May 31, 1994

[54] INTEGRATED MASS STORAGE DEVICE

[75] Inventors: Calvin F. Quate, Stanford; Mark J. Zdeblick, Los Altos; Thomas R. Albrecht, San Jose, all of Calif.

[73] Assignee: The Board of Trustees of the Leland Stanford University, Stanford, Calif.

[21] Appl. No.: 566,335

[22] PCT Filed: Jan. 27, 1989

[86] PCT No.: PCT/US89/00277

§ 371 Date: Aug. 17, 1990

§ 102(e) Date: Aug. 17, 1990

Related U.S. Application Data

[63] Continuation-in-part of Ser. No. 149,236, Jan. 22, 1988, Pat. No. 4,906,840.

[51] Int. Cl.⁵ .............. G11C 11/00; G11C 13/00; G01N 23/00; G21K 7/00
[52] U.S. Cl. .................... 365/151; 250/306; 250/307
[58] Field of Search ............ 365/151; 250/306, 423 F, 250/307; 358/909

[56] References Cited

U.S. PATENT DOCUMENTS

| | | | |
|---|---|---|---|
| Re. 33,387 | 10/1990 | Binning | 250/306 |
| 4,575,822 | 3/1986 | Quate | 365/151 |
| 4,594,526 | 6/1986 | Araki et al. | 310/317 |
| 4,647,976 | 3/1987 | Nakagaki et al. | 358/909 |
| 4,651,227 | 3/1987 | Yunoki et al. | 358/909 |
| 4,668,865 | 5/1987 | Gimzewski et al. | 250/306 |
| 4,806,755 | 2/1989 | Duerig et al. | 250/306 |
| 4,831,614 | 5/1989 | Duerig et al. | 365/151 |

FOREIGN PATENT DOCUMENTS

| | | |
|---|---|---|
| 247219 | 5/1986 | European Pat. Off. |
| 194323 | 9/1986 | European Pat. Off. |
| 251177 | 6/1987 | European Pat. Off. |
| 272935 | 12/1987 | European Pat. Off. |
| 57-115887 | 7/1982 | Japan |
| 2089169 | 12/1981 | United Kingdom |

OTHER PUBLICATIONS

"Atomic Force Microscope" in *Physical Review Letters* by Binnig et al vol. 56, No. 9, Mar. 86, pp. 930-933.
"Bimorph-driven x-y-z translation stage for scanned image microscopy"; Review of Scientific Instruments 58(4); Apr. 1987; pp. 567-570; J. R. Matey et al.

*Primary Examiner*—Joseph L. Dixon
*Assistant Examiner*—Michael A. Whitfield
*Attorney, Agent, or Firm*—Flehr, Hohbach, Test, Albritton & Herbert

[57] ABSTRACT

A integrated mass memory device is formed by combining a piezoelectric bimorph cantilever (214) with a recording surface (212) having a number of storage locations to and from which digital information is transferred using a scanning tunneling microscope or an atomic force microscope mode of operation. Controls circuits (240) are provided for controlling the scanning of the recording surface (212) and for writing and reading information into and from the recording surface. An image storage system stores images captured from an optical sensor using piezoelectric bimorph cantilevers for reading and writing digital information on recording surfaces.

14 Claims, 16 Drawing Sheets

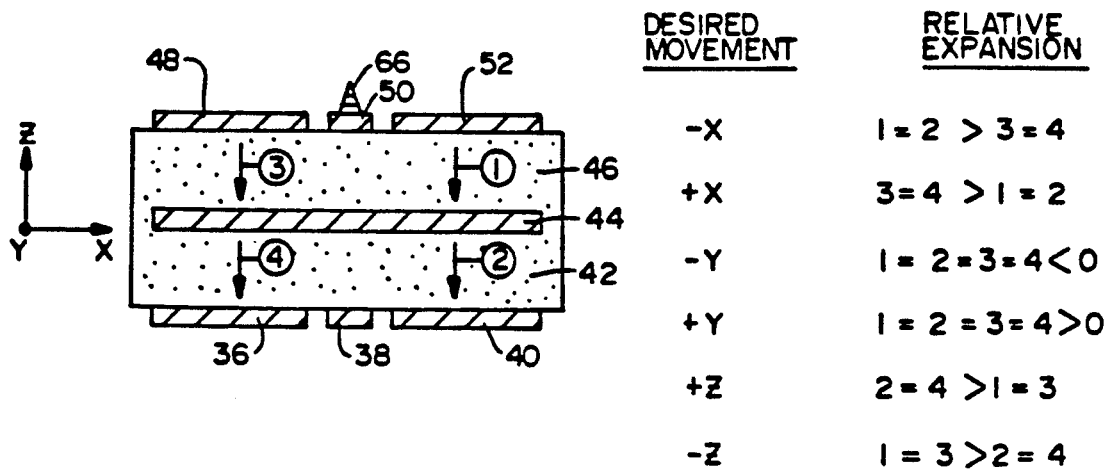
FIG. 13
FIG. 14
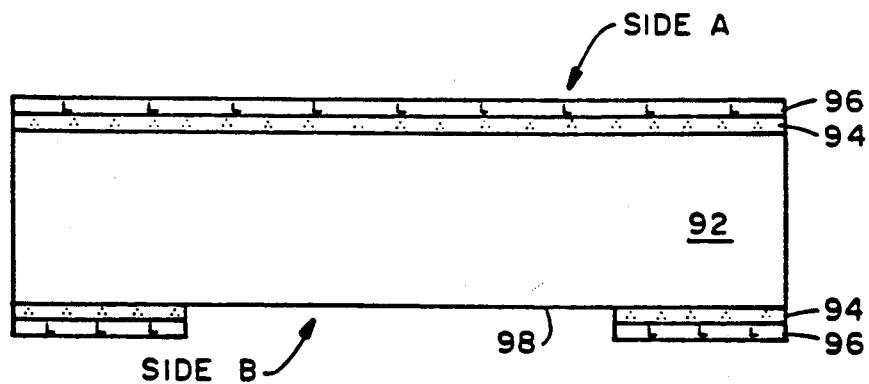
FIG. 15

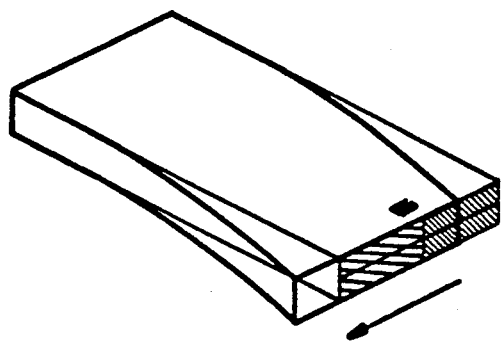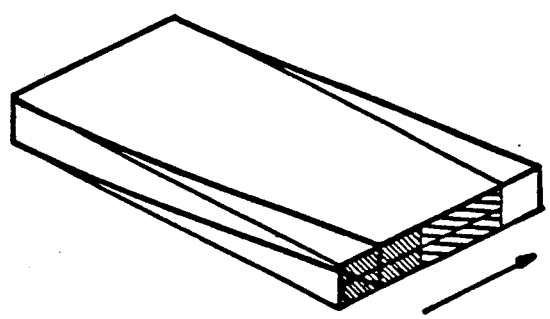
FIG. 36(a)   FIG. 36(b)
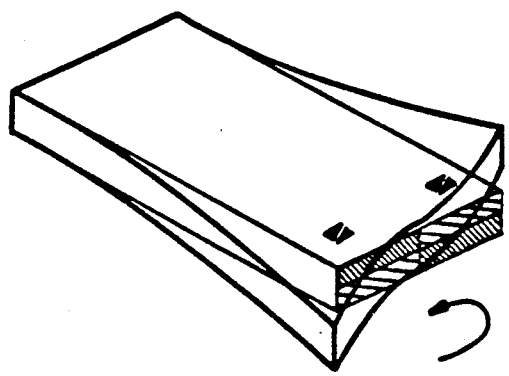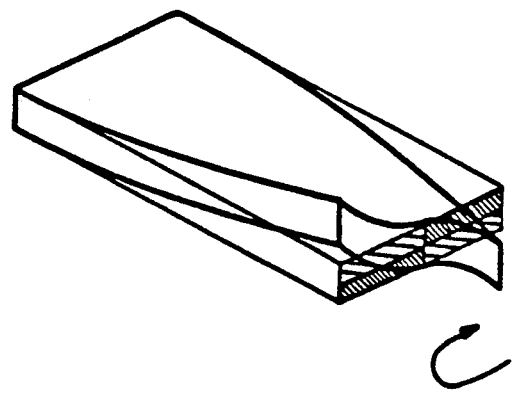
FIG. 37(a)   FIG. 37(b)

INTEGRATED MASS STORAGE DEVICE

The U.S. Government has a paid-up license in this invention and the right in limited circumstances to require the patent owner to license others on reasonable terms as provided for by the terms of Contract No. N00014-84-K-0624 awarded by the Department of the Navy.

CROSS REFERENCE TO RELATED APPLICATIONS

This application is a continuation-in-part of U.S. patent application Ser. No. 149,236 filed Jan. 27, 1988, now U.S. Pat. No. 4,906,840, and assigned to the assignee of the present invention.

BACKGROUND OF THE INVENTION

1. Field of the Invention:

The invention pertains to the field of scanning tunneling microscopes, and more particularly, to the field of integrated versions of same.

Scanning tunneling microscopes were first invented by a team of researchers from IBM (Binnig and Rohrer). The basic concept of a scanning tunneling microscope is to place a very sharp, conducting tip having tip dimensions on the order of the size of 1 atom in diameter close to a conductive surface. If the tip is brought very close to a conductive surface, i.e., within the space of the diameters of several atoms, (approximately within 5 angstroms), a tunneling current flows between the tip and the surface. That is, the probability density function of electrons for atoms in the tip overlaps in space the probability density function of electrons for atoms on the surface. As a result, tunneling occurs in the form of electron current flow between the tip and the surface if a suitable bias voltage between these two conductors is applied.

The magnitude of the tunneling current is exponentially dependent upon the distance between the tip and the surface. If the distance between the tip and the surface increases by only 1 angstrom, the current is reduced by a factor of 10. Typically, 100 millivolts of bias voltage will provide 1 nanoampere of current for a tip to sample spacing of a few angstroms.

This tunneling current phenomenon can be used to take an image of the surface. To do this, the tip must be placed very close to the surface and must be moved in raster scan-like fashion across the surface while maintaining the relative distance between the tip and the surface. The tip must be moved up and down to follow the contour of the surface to maintain a relatively constant distance between the highest point on the surface and the tip. This distance must be accurately maintained to be within the tunneling overlap distance to maintain constant current flow. As the tip is scanned across the contour of the surface, an image of the surface contour may be built up by keeping track of the movements of the tip. Typically this process of tracking the tip movement is done by keeping track of the voltage applied across a piezoelectric transducer which moves the tip to maintain the constant distance between the tip and the surface. Typically the apparatus that controls the tip distance monitors the current flowing between the tip and the surface and controls a mechanical system to move the tip in such a manner as to stabilize the current flowing between the tip and the surface at some steady state value. Thus, changes in the current will result in changes in the distance between the tip and the surface so as to counteract the changes in the current and stabilize it at a steady state value. Thus, changes in the drive signals to the tip movement mechanism track changes in the surface contour as the height of the tip above the surface is adjusted to maintain constant current.

2. Prior Art:

A collection of papers defining the state of the art in scanning tunneling microscopy is published in the *IBM Journal of Research and Development*, Vol. 30, No. 4, pages 353-440, July 1986. In an article entitled "Scanning Tunneling Microscopy" by Binnig and Rohrer at pages 355-369 of that journal, a scanning tunneling microscope is depicted in FIG. 2 using a piezoelectric tripod. This tripod consists of 3 piezoelectric rods of material joined at a junction; each rod expands and contracts along one of 3 Cartesian coordinate axes. The tip is mounted at the junction of the 3 rods. The tip is brought into proximity of the surface by a rough positioner. Thereafter the piezoelectric tripods are used to scan the tip across the surface to develop an image of that surface. The collection of papers in the *IBM Journal of Research and Development* shows scanning tunneling microscopy as being done with large scale apparatus.

One reference teaches an integrated form of a scanning tunneling microscope. This reference is European Patent Application Publication No. 0194323A1 published Sep. 17, 1986 based on European Application 85102554.4 filed Jul. 3, 1985. This patent application describes a scanning tunneling microscope integrated on a semiconductor chip into which slots are etched to form a center portion cantilever. The slots are etched to have mutually orthogonal directions to allow the center portion to perform movements in the X and Y direction under the control of electrostatic forces created between the stripes defined by the slots and their opposite walls. A protruding tip is formed on the center portion which is capable of being moved in the Z direction by means of electrostatic forces. Electrostatic forces are not ideal for tip movement to obtain maximum accuracy. Also, the integrated STM described in the European Patent Application cited above would be difficult to successfully fabricate.

Thus, a need has arisen for an integrated version of the scanning tunneling microscope using piezoelectric means for moving the tip.

Advances in the application of electronics technology has made it possible to convert a two-dimensional optical image to a train of electrical signals. A common application of this technology is found the portable video cameras and recorders, or camcorders, wherein a two-dimensional CCD array is used to scan an optical image and convert it to an electrical signal that is linear in time. In turn, the electrical signal is stored on a magnetic tape of the form that is commonly found in video recorders. The image is played back onto a television screen with the VCR. This system is large and bulky in spite of the advances that have been made in size reduction.

SUMMARY OF THE INVENTION

According to the teachings of the invention, there is disclosed both an integrated piezoelectric transducer of novel construction and an integrated scanning tunneling microscope using this piezoelectric transducer for the necessary tip movement. The piezoelectric transducer uses bimorph technology.

In one embodiment of the piezoelectric transducer, a layer of spacer material which will later be removed, is placed over the surface of a silicon or other substrate. Thereafter, a layer of conductive material is formed on the spacer layer and patterned to form three separate electrodes. Then a layer of piezoelectric material is formed over the three electrodes and another layer of conductive material is formed over the layer of piezoelectric material. A second layer of piezoelectric material is then formed over the middle conductor. Finally, a third conductive layer is formed over the second piezoelectric material layer and is patterned to form three separate electrodes which are aligned with the three electrodes of the bottom-most conductive layer. Then a sharp, conductive tip is formed on the center electrode on the uppermost conductive layer. This tip is formed by evaporation deposition of a conductive material through a shadow mask. The evaporation deposition forms a cone of material of ever decreasing diameter on the center, top electrode. The ever-decreasing diameter results as the material landing on the shadow mask slowly closes off the hole in the mask above the point where the tip is being formed.

After the foregoing structure is formed, the sides of the piezoelectric material are etched away to form the bimorph lever. This etching is performed in such a manner that sufficient piezoelectric material is left on the sides to completely encase the center electrode. This etching of the piezoelectric material is done by first depositing a layer of titanium/tungsten metal and patterning this layer to act as an etch mask. This layer of metal is patterned using conventional photolithography techniques to define where the edge of the piezoelectric material is to be. After the metal etch mask is formed, the zinc oxide piezoelectric material is etched using the metal mask as a guide. If other piezoelectric materials are used which may be etched with good resolution, this step of depositing and forming a metal etch mask may be eliminated. Zinc oxide is a piezoelectric material which cannot easily be etched with good resolution. The step of forming the metal etch mask substantially improves the resolution which may be obtained in etching the zinc oxide material. "Resolution" as the term is used here is intended to specify the degree of control over the position of the edge of the zinc oxide.

After the piezoelectric material has been etched, the spacer material underlying the entire structure is removed. This spacer material is removed only up to the point where the cantilever bimorph is to be physically attached to the substrate. Removal of the spacer material causes the bimorph cantilever to extend out from its attachment point over the substrate with an air space between the bottom of the bimorph and the top surface of the substrate. This allows the bimorph to move up and down normal to the surface of the substrate by the effect of the piezoelectric material thereby allowing the tip to be moved. The existence of four pairs of electrodes and two layers of piezo material in this embodiment, allows three axis movement of the tip to be obtained.

To operate the structure just described so as to cause the tip to make raster scanning movements, various voltage combinations are applied to the four pairs of electrodes formed by the middle layer electrode and the outer electrodes on the bottom and top electrode layers. By suitably controlling the voltages applied to these four electrode pairs, the tip may be made to move along any of the three axes in a Cartesian coordinate system.

In alternative embodiments, two such bimorph structures each having two piezo layers but only two pairs of electrodes, formed as previously described, may be fabricated so as to extend out over the substrate from their attachment points and to intersect each other at a 90° angle and to be joined at the intersection. These two bimorphs may then be controlled in a similar manner to the manner described above for a single bimorph to move the intersection point along any of the three axes of a Cartesian coordinate system. In an alternative embodiment, two conductive tips may be formed at the end of the bimorph and the voltages applied to the electrodes may be manipulated so that the tip of the bimorph rotates to provide independent Z axis motion for each tip and synchronous X and Y motion for both tips.

An alternative, and preferred, embodiment of the method for forming the bimorph piezoelectric transducer structure described above, is to form the multilayer structure directly on a silicon substrate without any spacer material as described above but to free the bimorph cantilever from the substrate by etching through to the under surface of the cantilevered bimorph from the back side of the wafer.

A scanning tunneling microscope according to the teachings of the invention may be made by using any of the processes described herein to manufacture a bimorph tip movement structure and then placing the tip sufficiently close to a conductive surface to be scanned such as by attaching to the substrate on which the bimorph is integrated another wafer containing the conductive surface to be scanned. Suitable known control circuitry may then be integrated on either substrate if it is of semiconductor material to sense the tunneling current and to control the voltages applied to the electrodes of the bimorph.

The scanning tunneling microscope structures in integrated form described herein have many potential applications including imaging at the atomic level, atomic scale lithography and mass storage. Mass storage systems of very high density can be formed using such a structure by defining a discrete number of "cells" within the raster scannable surface of a conductive plane formed adjacent to the tip. Each cell constitutes one memory location. Each memory location is written as a 1 or 0 by depositing a molecule of sufficient size to be detected by the scanning tunneling microscope within each cell to form a 1 and not depositing such a molecule in the cell to form a 0. As the scanning tunneling microscope raster scans over such a surface, those cells wherein molecules are deposited are read as ones as the tip is forced by its control system to move away from the surface to maintain a steady tunneling current as the tip passes over the molecule. Essentially, the molecule forms a "hill" in an otherwise smooth surface. This hill causes the distance between the tip and the top of the molecule to decrease, thereby substantially increasing the tunneling current. The control system detects this increase and sends the appropriate voltages to the bimorph cantilever to cause the tip to move away from the surface sufficiently to bring the tunneling current back down to the constant level for which the system is calibrated. This movement of the tip or change in the voltages sent to the bimorph electrodes is detected and read as a logic 1. Other circuitry keeps track of the tip position and signals as each new cell is traversed. Thus, such a movement of a tip as it traverses a particular cell can be read as a 1 and lack of movement as it traverses another cell can be read as a 0. Such mass storage systems have the potential for tremendous information storage density because of the small, atomic scale dimensions involved.

Imaging applications of such a scanning tunneling microscope provide the ability to see the characteristics of surfaces on an atomic scale with greater resolution than has heretofore been attained. This allows the examination of such surfaces as semiconductor substrates during various stages of processing for research and development or quality control purposes. Vast numbers of other applications will be appreciated by those skilled in the art.

Piezoelectric bimorph cantilevers and the surfaces scanned therewith are mounted on the same silicon substrate to form scanning tunneling microscopes or atomic force microscopes which are incorporated into mass memory devices. A recording surface has various locations at which information is stored. Formed on the same substrate are control circuits for controlling scanning of the recording surface. Recording and playback, or writing and reading of information, is accomplished by several alternative mechanisms, including STM and AFM techniques. Image sensors, such as CCD devices, and signal processing circuits, such as analog-to-digital converters and digital-to-analog converters are formed on the same substrate as the memory units provided by combination of cantilever arms with recording surfaces.

BRIEF DESCRIPTION OF THE DRAWINGS

FIG. 13 is a diagram of the four pairs of electrodes in the one cantilever bimorph used to explain how three axis motion is achieved.

FIG. 14 is a table of the various voltages that must be applied to achieve motion in any particular axis.

FIGS. 15-20 are cross sectional diagrams longitudinally through one bimorph of an alternative two bimorph piezoelectric transducer according to the teachings of the invention.

FIGS. 37(a) and (b) represent the types of rotational motion that can be achieved in two tip embodiments using a bimorph having the construction shown in FIG. 10 to provide independent Z axis motion and synchronous X and Y motion.

DETAILED DESCRIPTION OF THE PREFERRED EMBODIMENT

Figure 1:
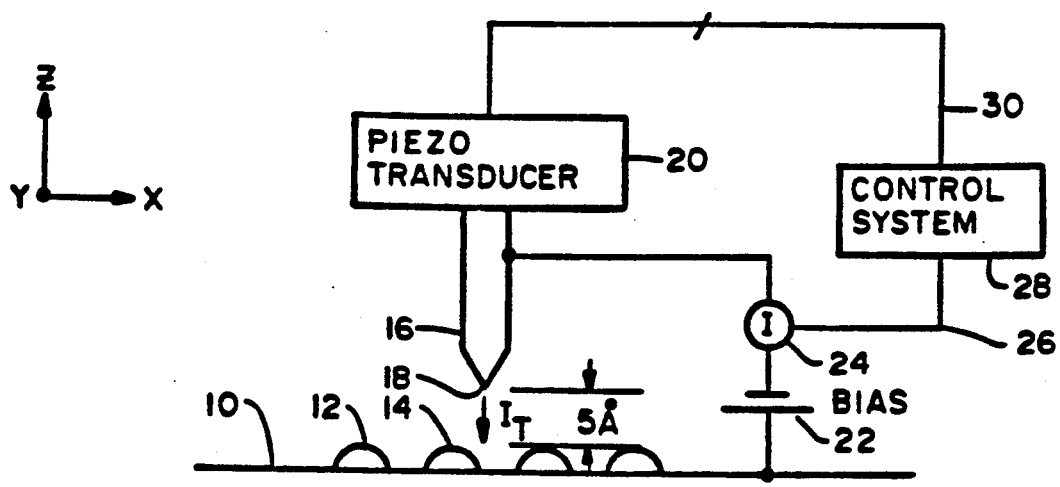
FIG. 1 is a diagram of a typical scanning tunneling microscope system.

Before discussing the details of the preferred and alternative embodiments of the integrated piezoelectric transducer, a scanning tunneling microscope (STM) using this transducer and methods for making these structures, it would be helpful to understand the teachings of the invention to explore the current state of the prior art in STM's. FIG. 1 depicts a prior art scanning tunneling microscope system which can be integrated according to the teachings of the invention. In FIG. 1, a conductive surface 10 having topographical features 12 and 14, etc., is scanned by a conductive tip 16. This tip is very narrow at its point, and preferably terminates in a single atom at the point 18.

The point 18 is scanned over the conductive surface 10 by a piezoelectric transducer 20. The purpose of this piezoelectric transducer is to scan the tip over the surface by defining a plurality of raster scan lines in the X-Y plane. The transducer 20 also moves the tip back and forth along the Z axis as the tip is scanned in the X-Y plane so as to maintain a distance between the tip 18 and the uppermost portion of the topographical feature over which the tip currently resides at a more or less constant distance. This distance is usually around 1 to 10 angstroms, and must be within the overlap region of the probability density functions of the electrons for the atoms in the tip 18 and the atoms in the uppermost regions of the topographical feature over which the tip currently resides. As long as the distance between the tip and the surface is within the overlap region of the probability density functions (tunneling range—usually less than 10 angstroms) and a bias voltage is applied across this junction, a tunneling current will flow between the tip 18 and the conductive surface. This tunneling current is symbolized by the arrow $I_T$.

The magnitude of the tunneling current $I_T$ is exponentially related to the distance between the tip and the surface. The magnitude of the tunneling current will decrease when the distance becomes larger and increase when the distance becomes smaller. To cause this tunneling current to flow, a bias voltage is applied between the tip 16 and the conductive surface 10 by a bias voltage source 22. A current sensor 24 senses the magnitude of the tunneling current $I_T$ and outputs a feedback signal on line 26 which is proportional to the magnitude of the tunneling current. A feedback circuit in control system 28 receives this feedback signal and generates suitable piezotransducer driving signals on the bus 30 to cause the piezoelectric transducer to move the tip 16 in such a manner as to maintain the tunneling current $I_T$ at a relatively constant value. The control system 28 also generates suitable piezoelectric transducer driving signals on the bus 30 to cause the tip 16 to be raster scanned across the conductive surface.

Figure 2A:
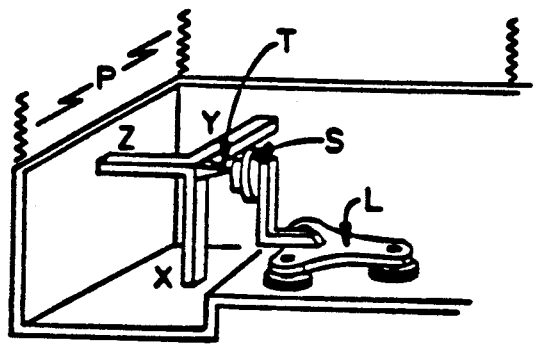
FIGS. 2(a) and 2(b) are a view of a prior art discrete, large scale scanning tunneling microscope invented by IBM.
Figure 2B:
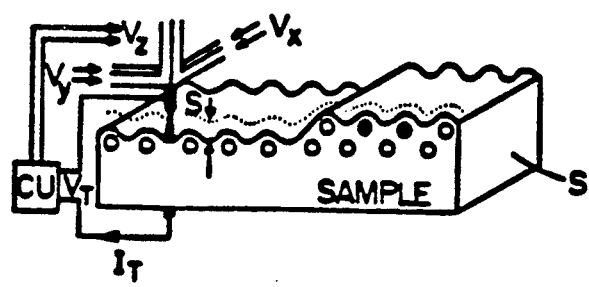

FIG. 2 is a diagram of a typical scanning tunneling microscope prior art structure as developed by IBM and as discussed in the above cited *IBM Journal of Research and Development*. FIG. 2 shows the mechanical details of the structure. The microscope tip T is scanned over the surface of a sample S with a piezoelectric tripod (X, Y, Z) in FIG. 2(a). A rough positioner L brings the sample within reach of the tripod. A vibration filter system P protects the instrument from external vibrations. In the constant tunneling current mode of operation, the voltage $V_Z$ is applied to the Z piezoelectric element by means of the control unit CU depicted in FIG. 2(b). The control unit keeps the tunneling current constant while the tip is scanned across the surface by altering the control voltages $V_X$ and $V_Y$. The trace of the tip generally resembles the surface topography. Inhomogeneities in the electronic structure of the sample's surface also produce structure in the tip trace. This is illustrated on the right half of the sample S as two surface atoms which have excess negative charge.

PROCESS #1

Figure 3:
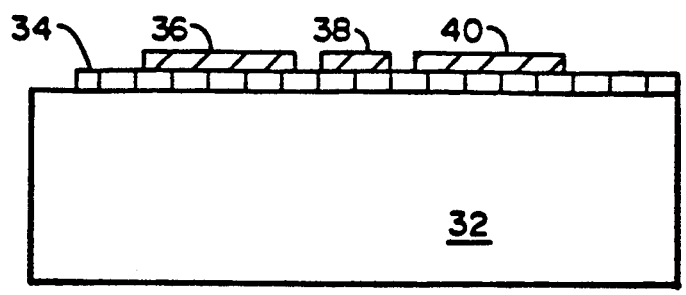
FIGS. 3-10 are successive cross sectional views along the transverse axis of the bimorph cantilever of the intermediate stages in a first process of fabrication of the preferred structure for an integrated single lever bimorph cantilever with tip for a scanning tunneling microscope according to the teachings of the invention.

Referring to FIG. 3 there is shown an integrated structure representing an intermediate stage after the first several steps in a process for making an integrated scanning tunneling microscope using an integrated piezoelectric transducer. Fabrication starts with a substrate 32. Preferably this substrate is silicon or some other substrate suitable for forming integrated electronic circuits. However, the substrate may be any other material which is chemically, mechanically and thermally compatible with the materials which will be formed on top of the substrate. It is preferable to make the substrate 32 of a semiconductor material so that the control circuitry which will be used to cause the tip movement via the piezoelectric bimorph can be formed on the same substrate as the bimorph itself.

The first step in the fabrication sequence is to deposit a spacer layer 34 under the portion of the bimorph that is to be cantilevered. The bimorph will be attached to the substrate at the end opposite the tip, so no spacer material is formed in this attachment region. This spacer layer will later be removed to provide a space between the uppermost surface (most positive Z coordinate) of the substrate 32 and the undersurface (most negative Z coordinate) of the piezoelectric bimorph which will be formed on top of the spacer layer 34. This will provide a clearance space for the piezoelectric bimorph to move along the Z axis. Preferably the spacer material is titanium, titanium/tungsten or polyimide. This spacer layer must be of a material such that it can be selectively etched without having the etchant attack the material of the substrate 32 or the material of the overlying electrode and piezoelectric material layers. This class of materials will be hereafter referred to s the class 1 group of materials. Any material which can be selectively etched without attacking the materials of the other layers will suffice for purposes of practicing the invention. Titanium/tungsten alloy (10% Ti: 90% W) is a class 1 material selectively etchable by hydrogen peroxide if the conductors are aluminum and the piezoelectric material is zinc oxide. Polyimide is another example of a class 1 material which can be selectively etched with an oxygen plasma. The thickness of the spacer layer 34 should be adequate to provide sufficient space for the bimorph to move in the negative Z direction.

Next, a layer of conductive material is deposited on top of the space layer. This layer of conductive material is photolithographically patterned and etched to form three electrodes 36, 38 and 40. The purpose of these electrodes will become clear later when the operation of the entire structure is detailed. Note, that although electrode 38 is shown to be more narrow than the electrodes 36 and 40 in the figures, in reality the electrodes 36, 38 and 40 are usually all the same size. This does not have to be the case however. The conductive layer from which the electrodes 36, 38 and 40 are formed is preferably of aluminum and is deposited to 0.1 to 1.0$\mu$ thickness. The electrodes 36 and 40 are patterned to be approximately 3$\mu$ wide each.

Figure 4:
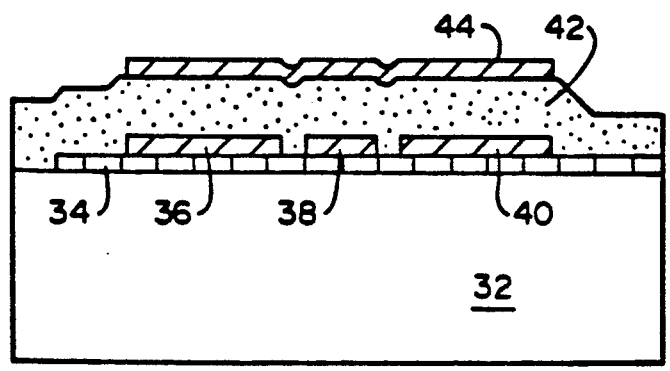

Referring to FIG. 4, there is shown another intermediate stage in the fabrication of the integrated piezoelectric scanning tunneling microscope after the first layer of piezoelectric material has been deposited. After formation of the first three electrodes, the next step in the process is to deposit the first layer of piezoelectric material over the entire surface of the chip. This layer 42 is zinc oxide in the preferred embodiment of the structure and is deposited to 2$\mu$ thickness by reactive sputtering in an oxygen ambient. Methods for depositing zinc oxide are well known and are described in the following references which are hereby incorporated by reference: Rozgonyi and Polito, *Preparation of ZnO Thin Films By Sputtering of the Compound in Oxygen and Argon*, Applied Physics Letters, pp. 220–223, Vol. 8, Number 9 (1966); Denburg, *Wide-Bandwidth High-Coupling Sputtered ZnO Transducers on Sapphire*, IEEE Transactions On Sonics and Ultrasonics, pp. 31–35, Vol. SU-18, No. 1, (January 1971); Larson et al., *RF Diode Sputtered ZnO Transducers*, IEEE Transactions on Sonics and Ultrasonics, pp. 18–22 (January 1972); Shiosaki et al., *Low-Frequency Piezoelectric-Transducer Applications of ZnO Film*, Applied Physics Lett., pp. 10–11, Vol. 35, No. 1, (Jul. 1, 1974); Khuri-Yakub et al., *Studies of the Optimum Conditions for Growth of RF-Sputtered ZnO Films*, pp. 32676-3272, Journal of Applied Physics, Vol. 46, No. 8 (August 1975); Chen et al., *Thin Film ZnO-MOS Transducer With Virtually DC Response*, pp. 945-948, 1985 Ultrasonics Symposium of IEEE; Royuer et al., *ZnO on Si Integrated Acoustic Sensor*, pp. 357–362, Sensors and Actuators, 4 (1983); Kim et al., *IC-Processed Piezoelectric Microphone*, pp. 467–8, IEEE Electron Device Letters, Vol. EDL-8, No. 10 (October 1987). Next, a layer of conductive material 44 is deposited over the first piezoelectric layer 42. The purpose of this conductive layer is to form a center electrode between the two layers of piezoelectric material which will be used to form the bimorph. Preferably, the layer 44 is aluminum and is deposited to 0.1 to 1.0$\mu$ thickness. From this layer a center electrode is photolithographically formed to be approximately 10 to 200$\mu$ wide.

Figure 5:
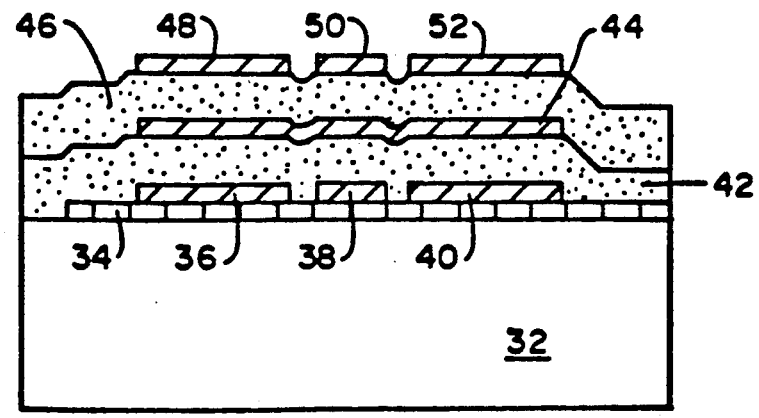

Referring to FIG. 5, there is shown another intermediate stage in the fabrication of the bimorph after the second piezoelectric layer has been deposited. This second piezoelectric layer 46 is zinc oxide in the preferred embodiment of the structure and is deposited to 2$\mu$ thickness. Next a layer of conductive material is deposited on top of the second piezoelectric layer 46. Preferably, this layer of conductive material is approximately 0.1 to 1.0μ thick aluminum. In some embodiments, an additional 1000 angstroms of gold is deposited on top of the aluminum. From this conductive layer, three electrodes 48, 50 and 52 are formed by photolithographic patterning. These electrodes are aligned with the locations of the electrodes 36, 38 and 40 and have the same widths as those electrodes. Preferably, the electrodes 48, 50 and 52 are deposited using lift-off techniques.

Figure 6:
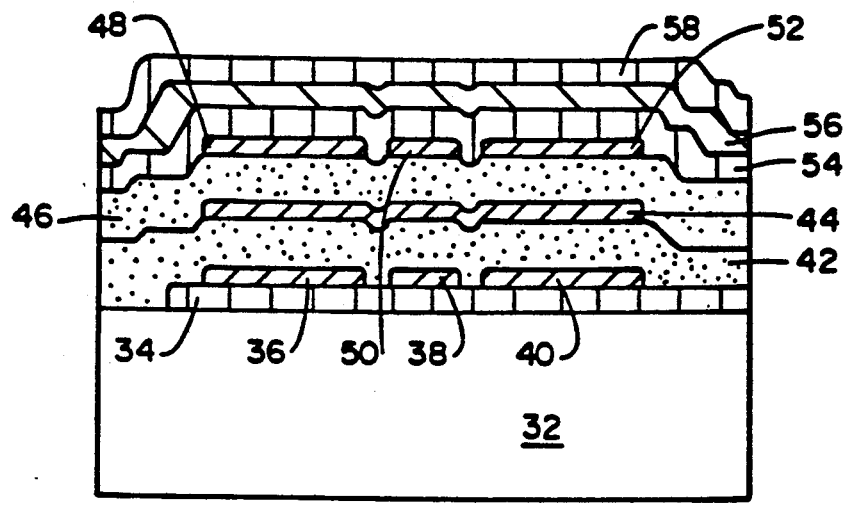

Referring to FIG. 6, there is shown an intermediate stage in the process of manufacture after the first few steps of the process of forming the tip on the center electrode 50 have been performed. Fabrication of metal cones by evaporation is not a new technique, but has been previously described by Spindt et al., *J. Appl. Phys.*, 47, 5248 (1976). FIG. 6 depicts an alternative embodiment of the tip formation process using an integrated shadow mask.

Basically the process of forming a tip having sufficient sharpness is best done through the use of a shadow mask. In FIG. 6, this shadow mask is formed from layers which are deposited over the uppermost group of three electrodes 48, 50 and 52. In the preferred embodiment of the structure, a separate wafer is processed to form a shadow mask with alignment keys, and this separate wafer is placed over the structure shown in FIG. 5 by aligning the alignment keys on each wafer. The separate wafer and the structure of FIG. 5 are then processed to have lock and key physical characteristics such that the aperture in the shadow mask can be properly aligned over the center electrode 50. In the alternative embodiment shown in FIG. 6, the first step in forming the integrated shadow mask is to deposit a layer 54 of the class 1 spacer material. Again, this layer 54 must be selectively etchable by an etchant which will not attack the material of the electrodes 48, 50 and 52, or the zinc oxide of the layers 46 and 42. The layer of the spacer material 54 need not be the same type of material as used in the spacer layer 34. However, the material of both of these layers must be within the class 1 group of materials. No patterning is performed on the layer 54, and it is allowed to cover the entire structure. Next, a layer 56 of a class 2 material, preferably copper, is deposited over the spacer layer 54. A class 2 material is any material which may be selectively etched by an etchant which will not attack the class 1 material used above and below it and which can be etched away after tip formation without etching the material of the tip. In the preferred embodiment of the structure, the spacer layer 54 is 1000 angstroms of titanium/tungsten alloy. The layer 56 of class 2 material is preferably 2μ of copper. Next, a 5000 angstrom layer 58 of class 1 spacer material is deposited over the class 2 layer 56.

Figure 7:
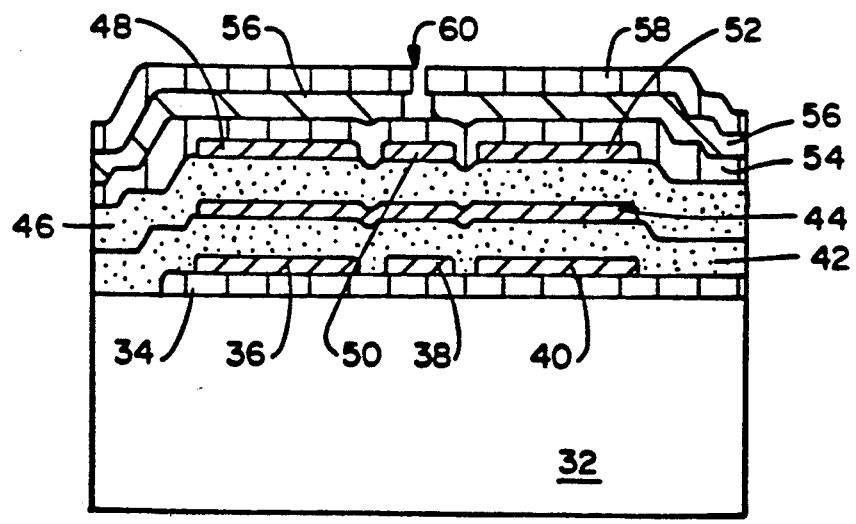

FIG. 7 shows the integrated structure at an intermediate stage during formation of the tip after etching of the spacer layer 58 and underetching of the class 2 layer 56. The formation of the tip is done by evaporation of a metal through a shadow mask aperture. This shadow mask aperture must be raised above the surface upon which the tip is to be formed so that a cone of material may be built up before the shadow mask aperture is closed off by the deposition of the material on top of the shadow mask. In FIG. 7, the shadow mask is the layer 58 and the shadow mask aperture is the opening 60 in this layer. The opening 60 is formed by using a selective etchant for the class 1 material of layer 58 and conventional photolithographic techniques. The aperture 60 is defined to be 1–2μ and is centered over the center of the electrode 50. Generally, the size of the aperture 60 should be much smaller than the size of the middle electrode 50. If the class 1 material of layer 58 is titanium/tungsten alloy, a suitable etchant for this selective etching step would be hydrogen peroxide.

After the aperture 60 is etched, the copper layer 56 must be etched back so as to underetch the perimeter of the aperture 60. The purpose for this underetching step is to provide clearance space for the walls of the tip cone which is to be formed later. The underetching step of the class 2 material of layer 56 is performed using a selective etchant which only attacks the class 2 material. If layer 56 is copper, this etch is performed using the aperture 60 as a mask and using a mixture of nitric acid, hydrogen peroxide, and water in a ratio of 10:1:100, respectively. That is, the etchant is 10 parts $HNO_3$ to 1 part $H_2O_2$ to 100 parts $H_2O$.

Figure 8:
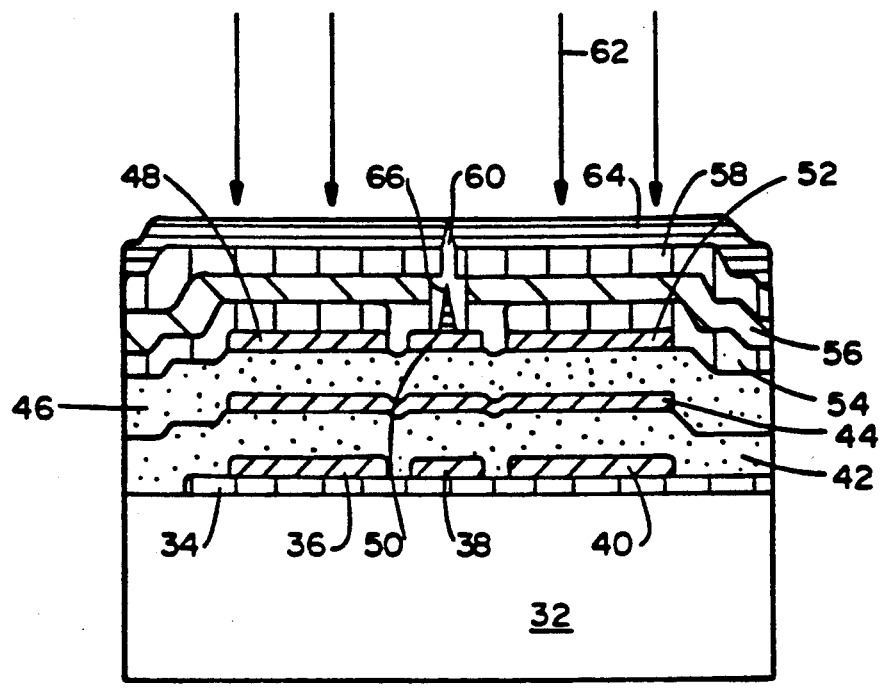
Figure 8:
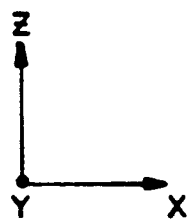

Referring to FIG. 8, there is shown the state of the structure in the intermediate stage of construction after formation of the tip but before removal of those layers which were formed in the process of forming the tip. Prior to the evaporation deposition of the tip material, a third etch step is performed to selectively etch through the class 1 material of layer 54 to form an aperture over the center electrode 50. In some embodiments, a cleaning step will then be performed to clean the surface of the electrode 50 to prepare it for tip deposition. This is done to better insure adhesion of the tip material to the electrode 50. The selective etching of the layer 54 is performed using a timed liquid etch or plasma etch to expose the top surface of the electrode 50. This etching step also etches a little of the layer 58 and all of layer 54 down to the electrode 50. For this reason, the layer 58 should be formed at least twice as thick and preferably 3 times as thick as the layer 54. A timed sputter etch is used to clean the surface of electrode 50 if needed. Where the boundary of the aperture in the layer 54 is relative to the boundary of the aperture in the layer 56 depends upon whether a liquid or plasma etch is used to etch the layer 54. The boundary of the aperture in the layer 54 will be collocated with the boundary of the aperture in the layer 56 for liquid etches and will be approximately located with the boundary of the aperture 60 in the layer 58 if a plasma etch in used.

Next, the tip 66 is formed. In the preferred embodiment of the structure, this tip is formed by evaporation in vacuum of tantalum or some other class 3 material. Any other material can be used for the tip 66 if it has the characteristics of a third class of materials hereafter defined. A class 3 material must be such that it does not oxidize appreciably in air and it must be such that it will not be etched by the etchant used to selectively etch the class 2 material of layer 56. Tantalum is such a material if copper is selected for the layer 56. Other possible materials for the tip would be aluminum coated with a noble metal by evaporation. Alternatively, the tip can be a noble metal standing alone, or any other conductor that can be selectively etched in the manner described above.

The evaporation of the class 3 material 62 from a pont (approximately 1–5 mm) located far (approximately 10 cm) above the surface results in the formation of the layer 64. Note that as the evaporation continues through the aperture 60, the aperture in the layer 64 slowly decreases in diameter as evaporation continues due to condensation of the evaporated material on the sidewalls of the aperture. As the diameter of the aperture in the layer 64 continually decreases, so does the diameter of the cone of material in the tip 66 being formed beneath this aperture. When the aperture in the layer 64 finally closes itself off, formation of the tip 66 is complete, and a very sharp tip (tip radius less than 1000 angstroms) will have been fabricated.

Figure 9:
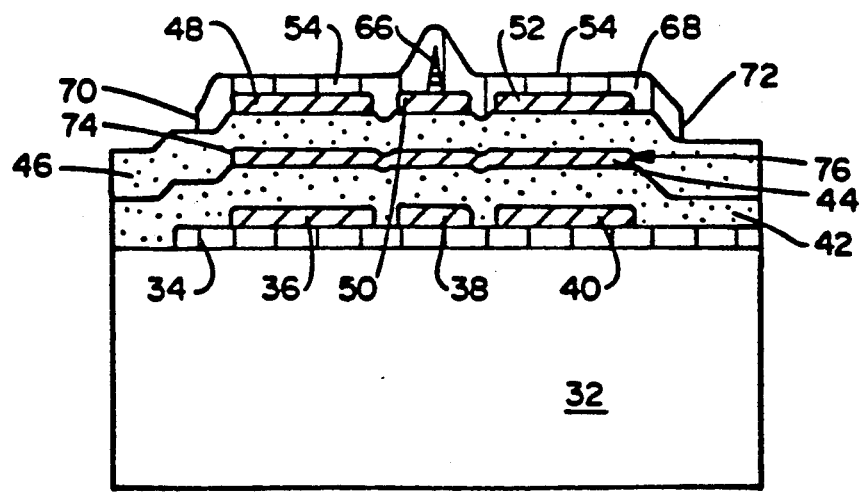

Referring to FIG. 9, there is shown a cross section of the structure at an intermediate stage in the construction after lift-off of the shadow mask layers and deposition of a zinc oxide etch mask layer. Following the processing steps described with reference to FIG. 8, it is necessary to remove the layers 54, 56, 58 and 64 so as to expose the tip 66. This is done using a lift-off etch to remove the class 2 material of layer 56. This lift-off etch removes all the layers above layer 54, i.e., the class 2 layer 56, the class 3 layer 64 and the class 1 layer 58.

Next, it is necessary to etch the piezoelectric layers 47 and 42 to define the sidewalls of the bimorph cantilever beam. This is done by photolithographically patterning the remaining layer 54 to serve as an etch mask for the zinc oxide as described previously. Layer 54 is patterned to have the configuration shown in FIG. 9. Note that the edges 70 and 72 of this layer are located along the X axis outside of the edges 74 and 76 of the metal electrode layer 44. The reason for this location is to insure that the edges 74 and 76 of the middle electrode are completely encased in the zinc oxide of the layers 46 and 42. The purpose for this is to prevent leakage currents and arcing between the electrodes 36, 40, 44, 48 and 52 which would lower the breakdown voltages and prevent the device from operating at high voltages. The purpose of formation of the etch mask 68 is to improve the resolution of the etching of the piezoelectric layers 42 and 46. Etching of piezoelectric material such as zinc oxide using photoresist provides very bad resolution as to the exact location of the edge of the piezoelectric material relative to the edge of the photoresist. It has been found that substantial improvements in the certainty of the location of this edge can be made by first forming an etch mask of the class 1 material such as titanium/tungsten alloy and then using this etch mask to guide the etching of the piezoelectric material. Thus, after the layer 68 is formed, a solution of 15 grams $NaNO_3$, 5 ml $HNO_3$ and 600 ml $H_2O$ is used to etch the piezoelectric layers 46 and 42 back to the approximate location of the edges 70 and 72.

After the tip is exposed, and the piezoelectric layers are etched, the spacer layer 34 is selectively etched away to free the cantilever.

Figure 10:
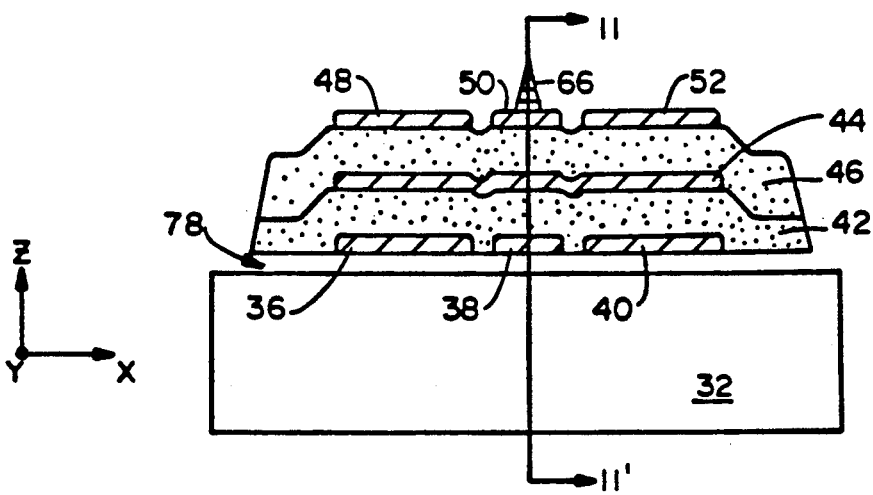

FIG. 10 shows in cross section the preferred final piezoelectric bimorph transducer structure in integrated form according to the teachings of the invention after selective etching of the spacer material layers 34 and the etch mask layer 54. Note the aperture 78 formed by the removal of the spacer layer 34. It is this void which allows the tip 66 to move along the Z axis under the influence of the forces generated by the piezoelectric material.

Figure 11:
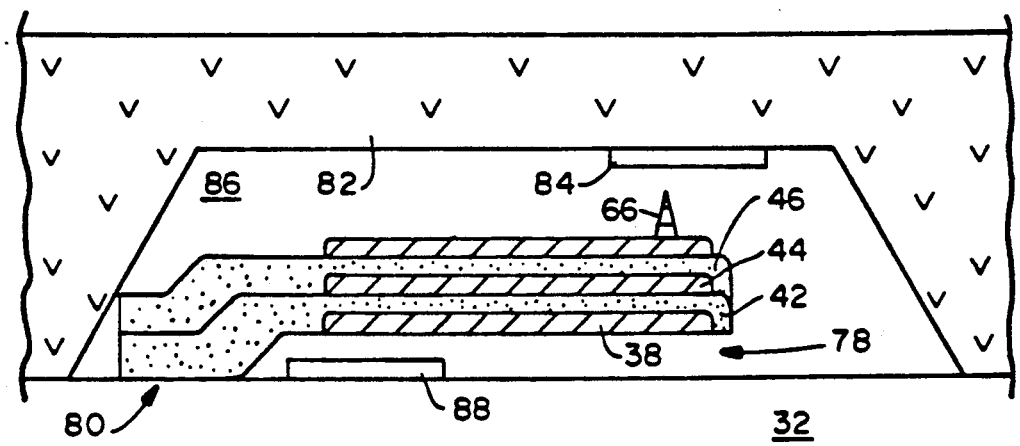
FIG. 11 is a cross sectional view of the final scanning tunneling microscope preferred structure taken along the longitudinal axis of the bimorph cantilever.
Figure 12:
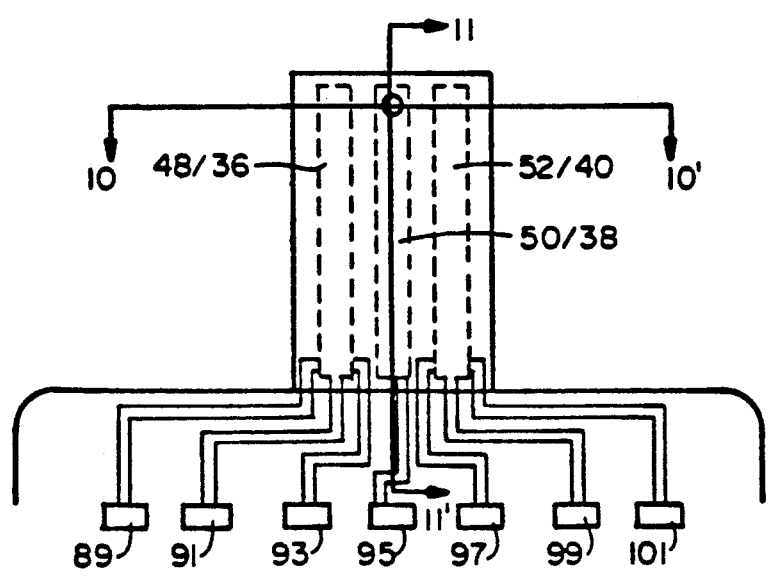
FIG. 12 is a plan view of the one cantilever preferred bimorph structure according to the teachings of the invention.

FIG. 11 shows a cross sectional view of the bimorph cantilever taken in the Y-Z plane, whereas the cross section of FIG. 10 is taken in the X-Z plane. A plan view of the bimorph cantilever is shown in FIG. 12 looking down the Z axis at the X-Y plane. FIG. 12 shows the locations of the sections taken in FIGS. 10 and 11 as the section lines 10—10' and 11—11', respectively. Note in FIG. 11 the cantilevered nature of the bimorph structure, the bimorph being attached to the substrate 32 only in the area 80. The relative dimension in FIG. 12 may be not truly indicative of an actual design which would be commercially employed. Bonding pads 89, 91 and 93 are coupled by conductive paths to the two electrode pairs comprised of electrodes 48, 36 and 44. Bonding pads 97, 99 and 101 are coupled by conductive paths to the two electrode pairs comprised of electrodes 52, 40 and 44. Bonding pad 95 is coupled by conductive paths to both the electrodes 50 and 38 and the tip 66. In embodiments where the control circuitry is integrated on the substrate 32, the bonding pads shown in FIG. 12 can be eliminated.

NECESSARY ADDITIONAL ELEMENTS NEEDED FOR AN STM

Referring again to FIG. 11, there are several additional elements of a scanning tunneling microscope system which are necessary for converting the cantilever bimorph piezoelectric transducer shown in FIG. 11 to a system having multiple commercial applications. An overlying wafer 82 having a conductive surface 84 is formed with a cavity 86 such that the wafer 82 may be physically attached to the substrate 32 with the conductive surface 84 overlying and within several microns of the end of the tip 66, such that the tip can be brought up to the surface 84 by bending of the bimorph. In the preferred embodiment of the scanning tunneling microscope (STM) structure, the wafer 82 may be Pyrex or silicon, but, in alternative embodiments, the wafer 82 may be any other material which is mechanically, thermally, and chemically compatible with the materials used in the rest of the structure. Preferably, the material of the wafer 82 should be such that a good bond may be made between the wafer 82 and the substrate 32, and such that suitable convenient fabrication techniques are known which may be used to form the cavity 82 and to attach a conducting surface 84 to the wafer 82. In still other alternative embodiments, the wafer 82 may be itself a conductive material such that no separate conductive surface 84 needs to be attached. In such embodiments, the cavity 86 should be such that the portion of the wafer 82 of interest is scanned by the tip 66. Also, the electrodes 36, 38, 40, 44, 48, 50 and 52 will have conductive pathways formed through the piezoelectric layers and across the surface of the substrate 32 to bonding pads such that the appropriate voltages may be applied to these electrodes to cause the tip 66 to scan in the desired manner. If these conductive pathways pass between the surface of the substrate 32 and the mating surface of the wafer 82, the materials for these two structural elements must be selected such that the conductive pathways may be properly formed.

In some embodiments, the control circuitry to supply the bias current to the tip 66 and to control the voltages applied to the various electrodes will be integrated on the substrate 32. The block 88 represents the integration of such known circuitry on the substrate in known manner. The position of the block 88 is illustrative only since this circuitry may be integrated on the side of the substrate, in a recess in the substrate, or on the reverse side of the wafer opposite the side from which the bimorph cantilever is formed. It is preferred to integrate the circuitry at a location to minimize the complexity of routing the various signals and control voltages to the appropriate nodes of the circuit.

The structure shown in FIG. 11 can be used for mass storage, microscopic photolithography, imaging and other commercial applications.

Referring to FIG. 13, there is shown a schematic diagram of a cross section through the bimorph cantilever to illustrate how the various electrodes are operated to cause movement of the cantilever in the Cartesian coordinate system. The cross section of FIG. 13 has the same orientation as the cross section 10—10' in FIG. 12. The vectors marked 1, 2, 3 and 4 in FIG. 13 represent the electric field vectors existing between the four pairs of electrodes. The electric field vector 1 represents the field between the electrode 52 and the center electrode 44. The electric field vector 2 represents the field between the center electrode 44 and the outer electrode 40. The electric field vector 3 represents the field between the electrode 48 and the center electrode 44, and the electric field vector 4 represents the field between the center electrode 44 and the outer electrode 36. In each case, the electric field is directly proportional to the potential difference applied to the pair of electrodes bounding the region of interest.

The nature of the piezoelectric zinc oxide is such that if a field is applied in the Z direction (which is along the crystalographic C-axis of the material) that causes the material to contract along that axis, and the material simultaneously expands along both the X and Y axes. Only expansions or contractions along the Y axis cause any bending of the bimorph. Hence, the following discussion refers to the Y-axis motion only.

Referring to FIG. 14, there is shown a table of the desired movements in the Cartesian coordinate system having the axes oriented as shown to the left of FIG. 13, said table correlating these desired movements to relative expansions in the piezoelectric material in accordance with the relationships given on the right half of the table. The manner in which the table of FIG. 14 is interpreted is as follows. If it is desired to cause movement of the bimorph of FIG. 13 in only the negative X direction, it is necessary to charge the electrodes 52 and 44, and 44 and 40, respectively, such that the relative Y-axis expansion of the piezoelectric material in the layers 46 and 42 between these two pairs of electrodes is equal. Further, it is necessary to charge the electrodes 48 and 44, and 44 and 36 such that the Y-axis expansion of the piezoelectric material in the layers 46 and 42 between these two pairs of electrodes is also equal, but such that the Y-axis expansion between the electrode pairs 48 and 44, and 44 and 46, respectively, is less than the expansion between the electrodes 52 and 44, and 44 and 40, respectively. In other words, if one thinks of the vectors marked 1–4 in FIG. 13 as the relative magnitude of the Y-axis expansion of the piezoelectric material in the layers 46 and 42 in the localized areas through which these vectors pass, then to obtain negative X movement of the bimorph, it is necessary that the expansions in areas 1 and 2 be equal and greater than the expansions in areas 3 and 4. This causes movement of the bimorph in the negative X direction in the same mechanical fashion as a bimetallic strip works where on layer of metal in the bimetallic strip expands less than the other layer of metal. This causes forces which tend to cause the strip to bend toward the strip which expands less. From FIG. 14, it is seen that for positive X expansion the situation is exactly opposite as the situation previously described. That is, the expansions in the areas 3 and 4 are equal and exceed the expansions in the areas 1 and 2. Likewise, for negative Y movement, i.e., movement into the page of the tip 66, it is necessary to charge the electrodes 48, 52, 44, 36 and 40 such that the piezoelectric material in regions 1–4 all contract an equal amount. This contraction is signified as expansion less than zero. For positive Y movement, it is necessary to charge the same electrode such that regions 1–4 all expand by the same amount which is signified by an expansion greater than zero. For positive Z movement, it is necessary to charge the electrodes such that regions 2 and 4 expand equally and greater than the expansion in regions 1 and 3. Likewise, for negative Z movement, it is necessary to charge the electrode such that regions 1 and 3 expand an equal amount and greater than the expansion in regions 2 and 4.

It is possible to obtain any desired movement in the Cartesian space defined by the 3 axes coordinate system to the left of FIG. 13 by superimposing these relationships from any one axis upon the relationships for another axis. That is, if both negative X and positive Y movement is simultaneously required, the relationships from these two lines of the table of FIG. 14 are superimposed such that all four regions are expanded equally by an amount A to obtain the desired Y component with an additional expansion of regions 1 and 2 by an amount B over the expansion of regions 3 and 4 to obtain the desired negative X component. Note that electrode 50 only serves as a signal connection to the tip 66. The bottom electrode 38 is charged with the same bias voltage applied to the top center electrode 50 and the tip to eliminate any spurious, parasitic movements caused by expansion or contraction in the piezoelectric layer 46 under the center electrode 50. Any such movement is cancelled by the movements in the layer 42 caused by the charge on the bottom center electrode 38.

PROCESS #2

Beginning at FIG. 15, the fabrication of the two arm bimorph embodiment of a piezoelectric transducer according to the teachings of the invention is shown. Note that FIGS. 15 through 20 show a view of one bimorph lengthwise similar to the view shown in FIG. 11 of the transducer built according to the previously described process.

Referring to FIG. 15, there is shown an intermediate stage in the process of making an arm of a two arm bimorph using a backside etch technique. A substrate 92 is chosen which is preferably a semiconductor, but which may also be, in alternative embodiments, other materials capable of being micromachined. Semiconductor is desirable for the substrate so that control circuitry may be integrated on the same die as the bimorph itself. The first step in the process is to grow a 500 angstrom thick layer of silicon dioxide 94. Next, a 900 angstrom thick layer of nitride ($Si_3N_4$) is grown, and conventional photolithography techniques are used to define and etch a hole through the oxide layer 94 and nitride layer 96 to expose the surface of the substrate 92 as shown at 98.

Figure 16:
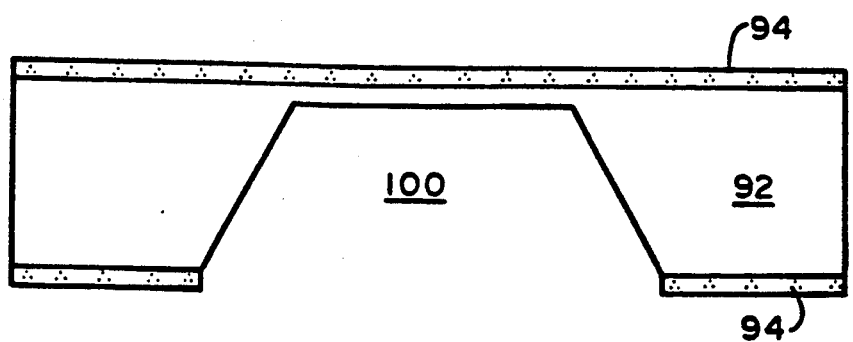

Referring to FIG. 16, there is shown another intermediate stage in the construction of a two arm bimorph after etching of the cavity. After defining the location of the aperture in the silicon dioxide and nitride layers as shown in FIG. 15, a KOH etch is used to etch a 350 $\mu$ deep trench in the substrate 92, using the nitride layer as an etch mask. This trench is shown at 100. Thereafter, the nitride layer 96 is stripped to leave only the silicon dioxide layer 94. Alignment marks are then patterned into side A to allow alignment to the pattern on side B (see FIG. 15).

Figure 17:
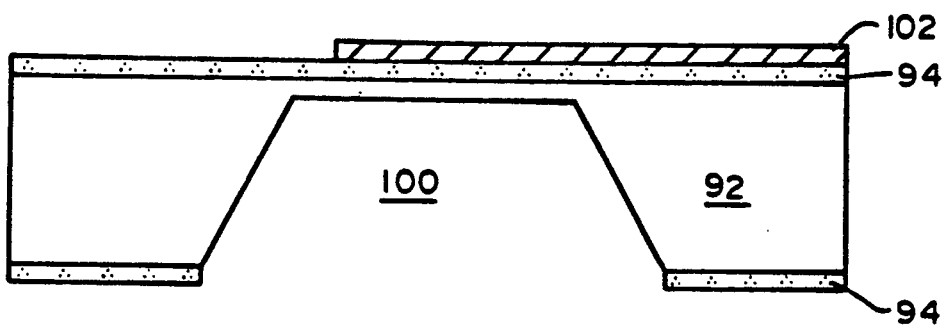

FIG. 17 shows another intermediate stage in the process after deposition of the first electrode layer. The next step is to deposit 0.1 to 1.0μ of aluminum and to pattern it to form the electrode shown at 102.

Figure 18:
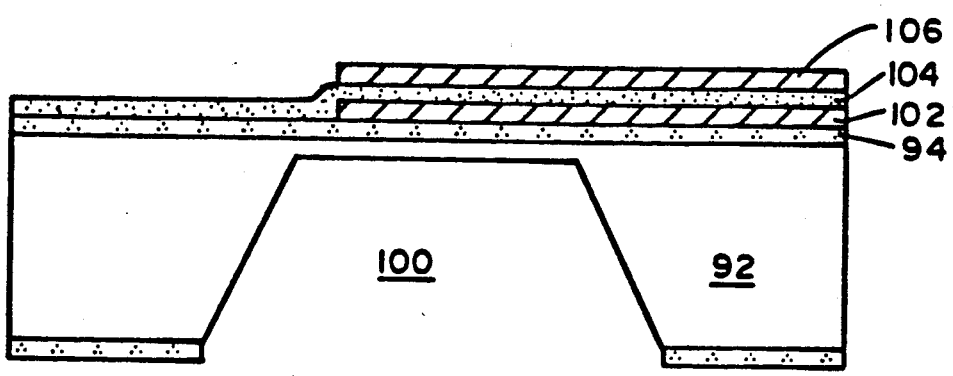

FIG. 18 shows another intermediate stage after deposition of the first piezoelectric layer and formation of a center electrode. After forming the electrode 102, a layer 104 of piezoelectric material is deposited. This layer is 2μ of zinc oxide or some other piezoelectric material. Next, a 0.1 to 1.0μ layer of aluminum is deposited and patterned and etched to form the center electrode 106.

Figure 19:
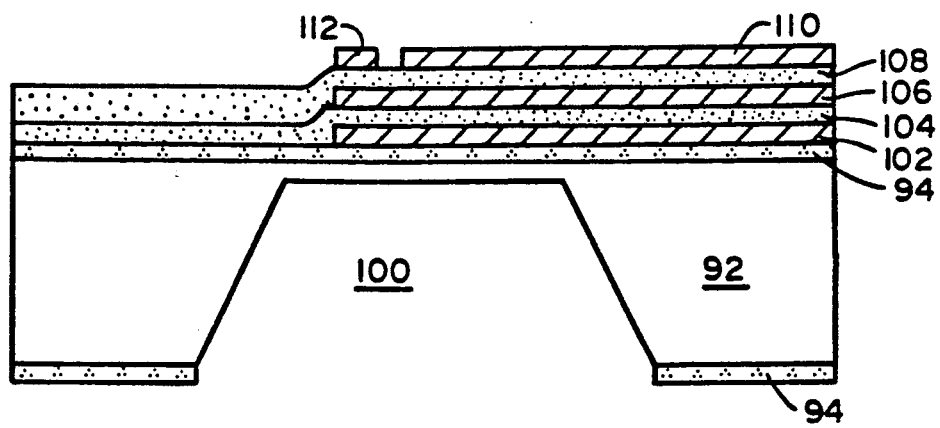

Referring to FIG. 19, there is shown an intermediate stage in the construction of the two arm bimorph after the second layer of piezoelectric material and the top electrode has been formed. After forming the middle electrode 106, 2μ of piezoelectric material are deposited in a layer 108. This layer is zinc oxide or some other piezoelectric material. Next, 0.1 to 1.0μ of aluminum and 1000 angstroms of gold are deposited over the piezoelectric layer 108. This layer of conductive material is then patterned and formed using lift-off techniques into the top electrode 110 and a tip electrode 112.

Figure 20:
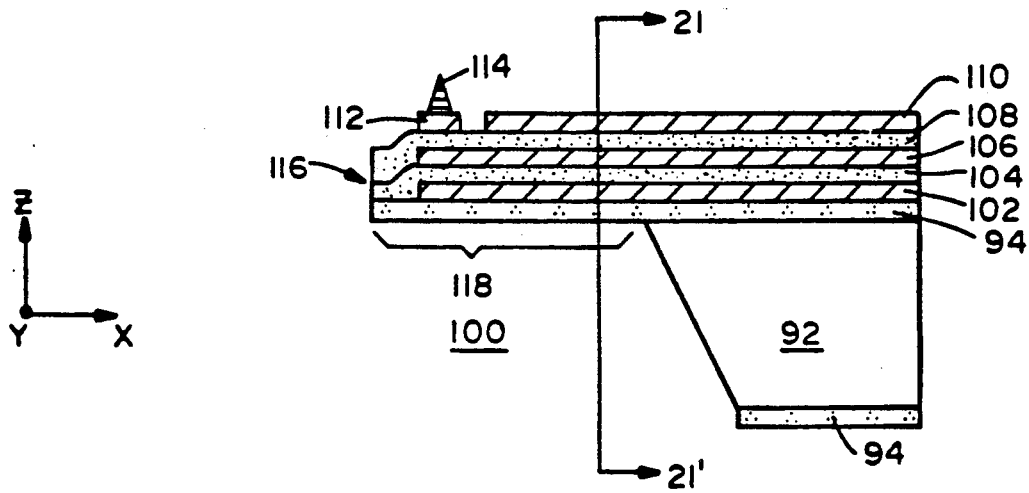

Referring to FIG. 20, there is shown another intermediate stage in the construction of the two arm bimorph after the tip has been formed and the structure has been underetched to free the bimorph. The process for forming the tip 114 is the same as described with reference to FIG. 3-10. After the tip is formed, the zinc oxide is patterned and etched to form the edge 116. This process is done using the same class 1 etch mask material as was used in the process described with reference to FIGS. 3-10. Finally, a plasma etch is used to etch through the remaining substrate 92 to the silicon dioxide layer 94 to free the bimorph arm from attachment to the substrate 92 along the area 118.

Figure 21:
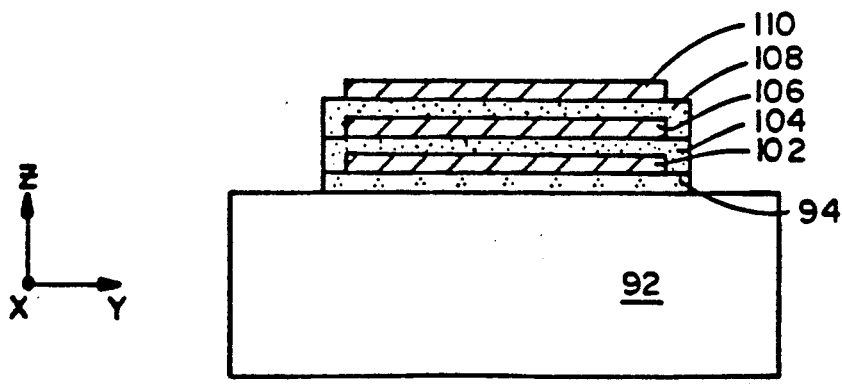
FIG. 21 is a transverse cross section of the bimorph construction in two bimorph embodiments.

FIG. 21 shows a cross section through the bimorph of FIG. 20 along the section line 21—21' in FIG. 20. As can be seen from FIG. 21 only two pairs of electrodes exist in the bimorph of FIG. 21. These two pairs of electrodes are the electrode 110 and the electrode 106, and the electrode 106 and the electrode 102, respectively. Those skilled in the art will appreciate that this structure will allow the bimorph to bend up and down along the Z axis and expand or contract longitudinally along the X axis.

In order to get 3 axis Cartesian coordinate movement, a second arm having the structure shown in FIGS. 20 and 21 must be formed and joined to the bimorph of FIGS. 20 and 21 at the location of the tip 114. A plan view of the structure of this bimorph arrangement is shown in FIG. 22.

Figure 22:
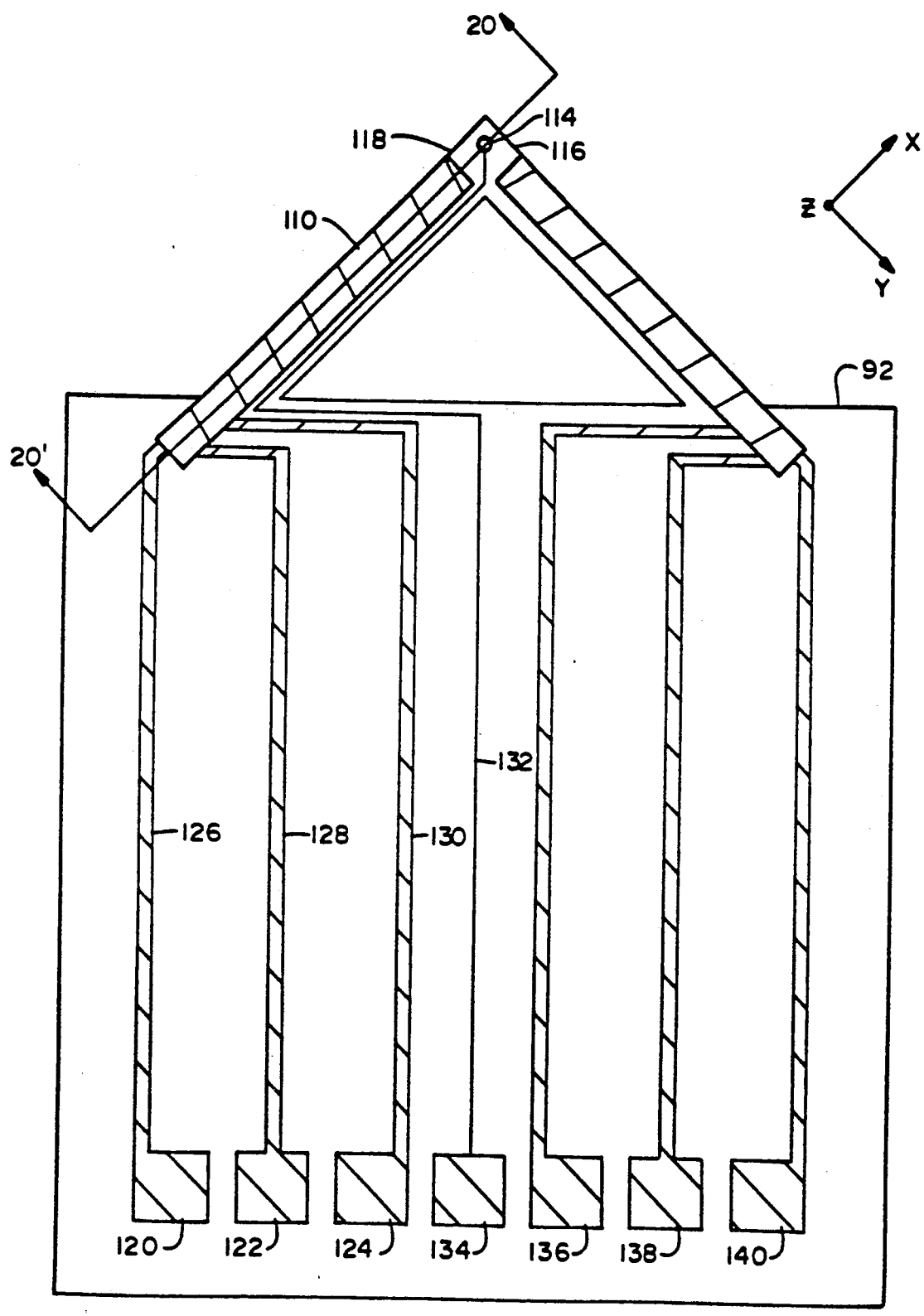
FIG. 22 is a plan view of a two bimorph embodiment of the invention with no control circuitry integrated on the substrate.

Referring to FIG. 22, the section line 20—20' indicates the position of the section through the structure of FIG. 22 as shown in FIG. 20. In the structure shown in FIG. 22, two bimorph arms, 116 and 118, extend from the substrate 92 at right angles joined at the approximate location of the tip 114. The bimorph 116 can move the tip 114 up and down along the Z axis and longitudinally along the X axis. The bimorph 116 can move the tip up and down along the Z axis and longitudinally along the Y axis. The bimorph 118 has its three electrodes 110, 106 and 102 coupled respectively to the bonding pads 120, 122 and 124. These connections are made via electrical conductors 126, 128 and 130, which are photolithographically formed simultaneously with the electrodes 110, 106 and 102 on the surface of the substrate 92. The tip 114 is coupled by an electrical conductor 132 to a bonding pad 134. The corresponding three electrodes of the bimorph 116 are coupled to bonding pads 136, 138 and 140. In alternative embodiments, the circuitry to drive bias voltages onto the six electrodes to cause movement of the tip and to bias the tip 114 with a correct voltage could be integrated on the substrate 92 thereby eliminating the need for the bonding pads shown at the bottom of FIG. 22. In such an embodiment, bonding pads would be present for supply of power to the circuitry used to bias the tip and drive the electrodes.

PROCESS #3—PREFERRED

Figure 23:
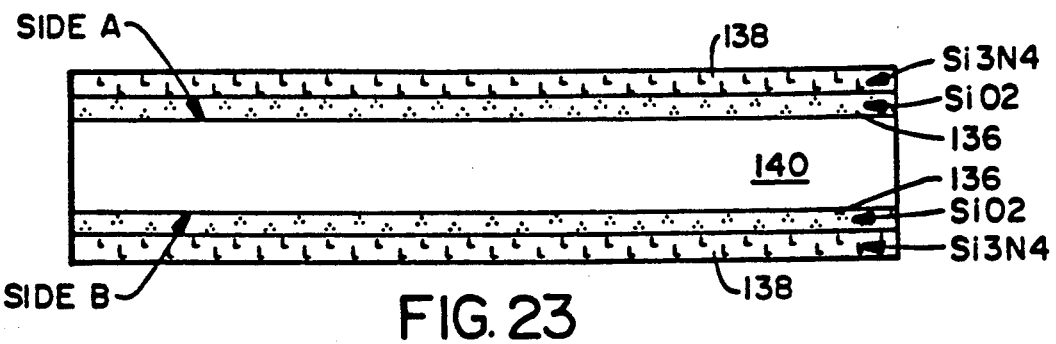
FIGS. 23-33 are cross sectional views of intermediate stages in the preferred process for construction of an integrated piezoelectric transducer and scanning tunneling microscope having either the preferred structure shown in FIG. 10 or the two arm structure shown in FIGS. 20 and 22.

The process described below is preferred to make either the one arm piezoelectric transducter having the structure of FIG. 10 or the two arm bipod piezoelectric transducer shown in plan view in FIG. 22 and in cross section in FIG. 20. Referring to FIG. 23, there is shown an intermediate stage in the preferred process for manufacturing a scanning tunneling microscope. The first step in the process is to clean a [100] silicon wafer of 380 micron thickness with a standard acid clean. The details of this cleaning process are given in Appendix A which is a detailed process schedule for the preferred process. Next, a layer 136 of silicon dioxide is thermally grown to a thickness of 5000 angstroms. Then, a layer 138 of silicon nitride is deposited to 1000 angstroms thickness over the silicon dioxide using low pressure chemical vapor deposition (LPCVD).

Figure 24:
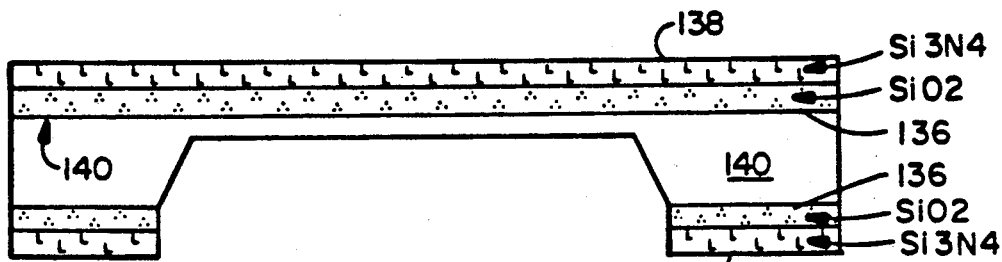

Referring to FIG. 24, there is shown the next stage in process after etching the backside pit. To free the bimorph cantilever to be formed later in the process, a backside etch is used. The first step in this process is to etch a pit in the backside. Negative photoresist (not shown) is applied and patterned to define the location of the pit. An oxygen plasma etch is then used to remove any remaining scum from the opening in the photoresist where the pit is to be formed. The details of this plasma etch are given in Appendix A. Next, the nitride layer 138 is etched using an $SF_6$ and F13B1 plasma etch at a ratio of 1:1. Then, the oxide layer 136 is etched using 6:1 buffered oxide etch solution (BOE). Following these two etch steps, the remaining photoresist (not shown) is removed and the wafer is cleaned using the process detailed in the appendix. Then 340 microns of silicon from the substrate 140 are etched away using the nitride/oxide layers as an etch mask. This etch is performed using a 30% KOH etch at 80 degrees C. The wafer is then rinsed in a 10:1 $H_2O$:HCl solution, followed by a rinse in deionized water. This leaves the pit 142.

Figure 25:
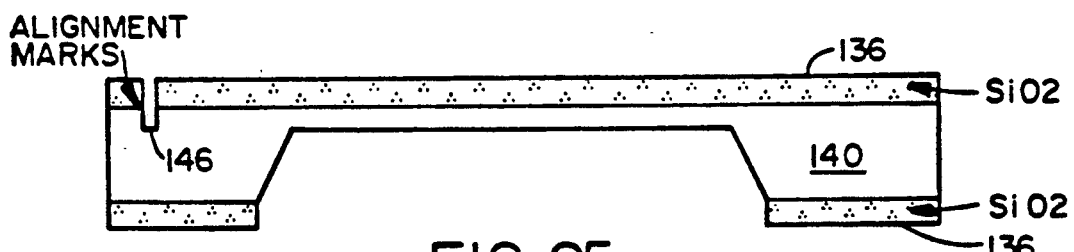

The substrate 140 has a polished front surface 144. Alignment marks are etched in this surface to facilitate the alignment of the various patterning steps to one another. FIG. 25 shows the wafer after this alignment mark 146 has been etched. The procedure for forming these alignment marks starts by patterning photoresist to define the positions of the alignment marks 146. Then an oxygen plasma etch is used to descum the openings and the nitride layer 138 and the oxide layer 136 are etched using the same procedure defined above in describing FIG. 24. A deionized water rinse and nitrogen ambient dry cycle are performed followed by etching of 3 microns of silicon using a 1:1 $SF_6$:$C_2ClF_5$ plasma etch. The wafer is then cleaned in accordance with the procedure outlined in Appendix A, and the remaining photoresist is removed. The layer of nitride 138 is then stripped using concentrated $H_3PO_4$ at 165 degrees C. for 1 hour followed by a deionized water rinse and a nitrogen ambient drying cycle.

Figure 26:
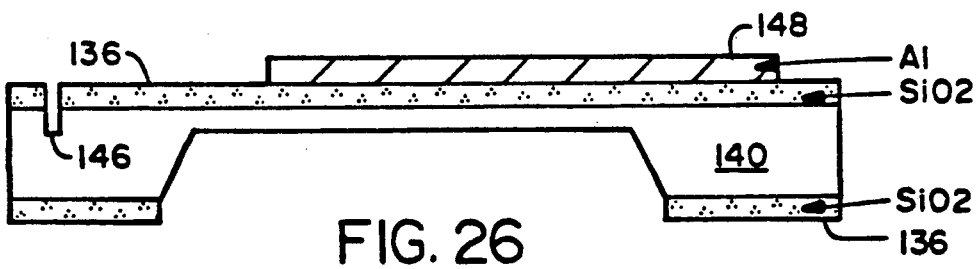

The next stage is shown in FIG. 26. To deposit the bottom electrode 148, the pattern of the electrode is defined with a positive resist liftoff process. Then the metal of the electrode is deposited by electron-beam evaporation deposition of 1000 angstroms of aluminum at room temperature. The excess aluminum is lifted off by soaking the wafer in hot acetone. The wafer is then rinsed in fresh acetone, methanol and deionized water and dryed in a nitrogen ambient.

Figure 27:
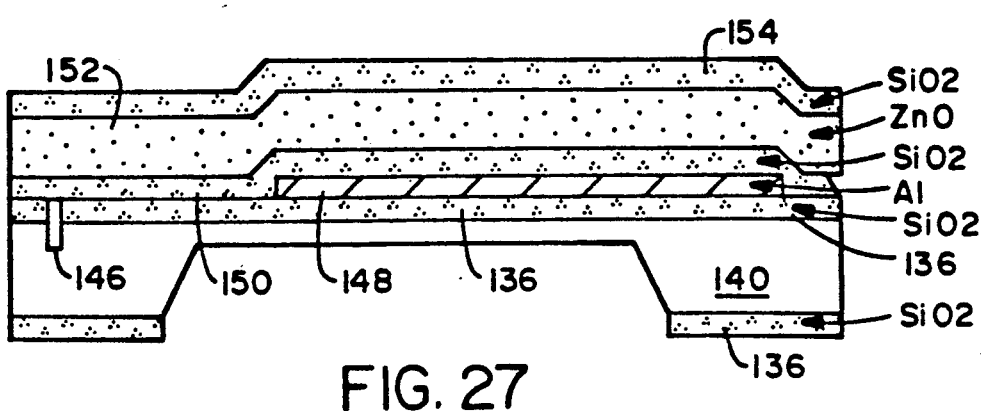

FIG. 27 defines the next stage in the process. After deposition of the lower electrode, it is necessary to deposit the piezoelectric layer. This is done by first sputter cleaning the surface for 30 seconds and electron beam evaporation deposition of 1000 angstroms of silicon dioxide 150 on the substrate while holding the substrate at a temperature of 200 degrees C. Next, a 2 micron layer 152 of zinc oxide is sputter deposited using a zinc target in 5:1 $O_2$:Ar gas ambient at 30 mTorr. During this process, the substrate is held to 300 degrees C. Then, a 1000 angstrom layer 154 of silicon dioxide is deposited over the zinc oxide by E-beam evaporation with the substrate at 200 degrees C.

Figure 28:
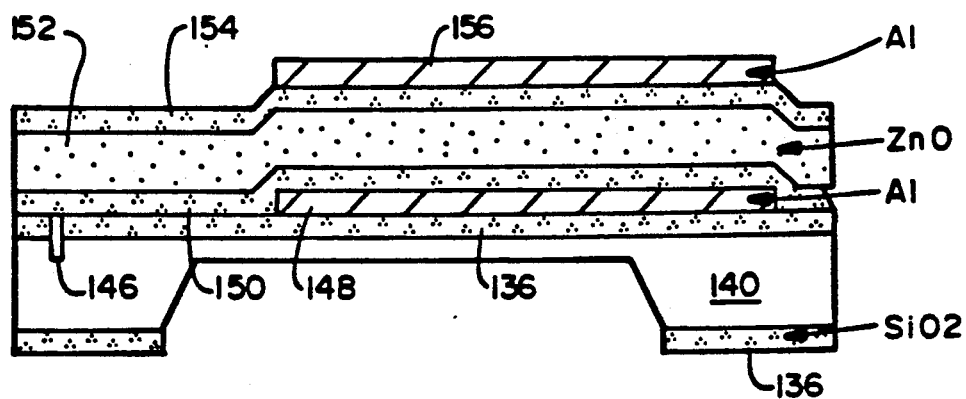

FIG. 28 shows the intermediate stage in the process after the middle electrode is formed. To deposit the middle electrode 156, the pattern for the electrode is defined using mask #4 and positive resist and a liftoff technique. Next, a 1000 angstrom layer of aluminum is deposited by electron beam evaporation using a room temperature wafer holder. The excess aluminum is then lifted off by soaking the wafer in hot acetone. The wafer is then rinsed in fresh acetone, methanol and deionized water followed by a drying cycle in nitrogen ambient.

Figure 29:
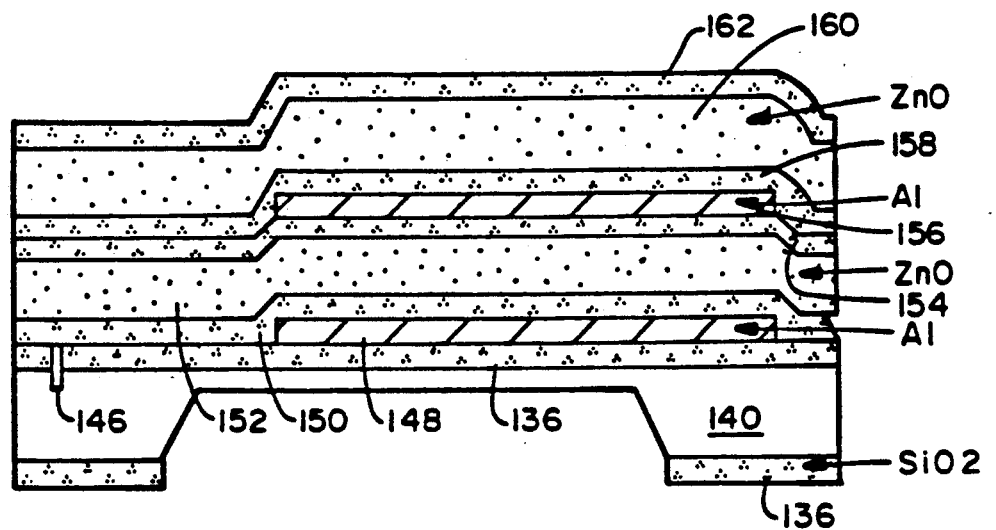

FIG. 29 shows the stage of the process after the upper oxide layers have been deposited. The first step in this process is to sputter clean the wafer for 30 seconds. Next, 1000 angstroms of silicon dioxide 158 are E-beam evaporation deposited with the substrate held at 200 degrees C. The top layer of piezoelectric material 160 is formed by depositing 2 microns of zinc oxide using a zinc target in a 5:1 mixture of oxygen and argon at 30 mTorr with the substrate at 300 degree C. Finally, a 1000 angstrom layer 162 of silicon dioxide is E-beam evaporation deposited over the zinc oxide with the substrate at 200 degrees C.

Figure 30:
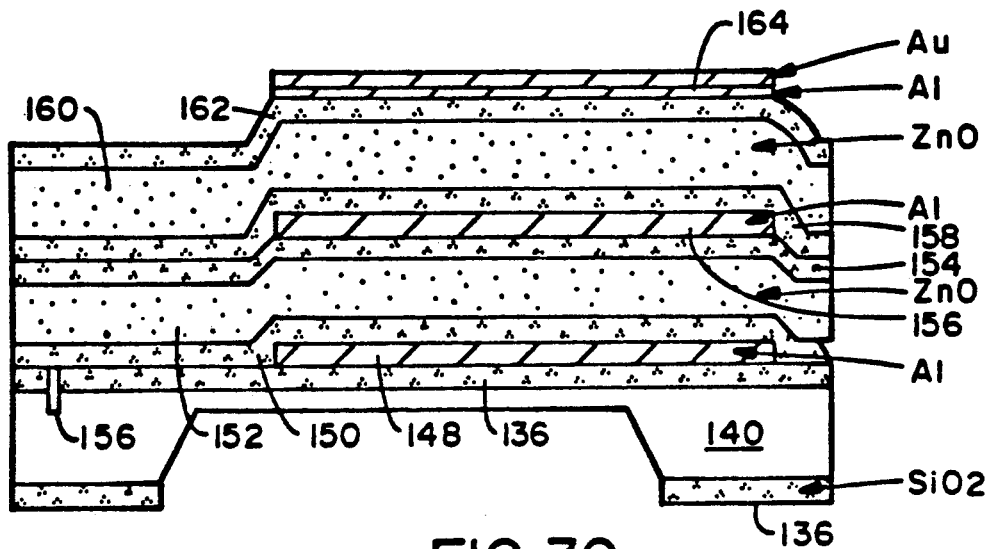

FIG. 30 shows the state of the wafer after the top electrode is formed. The top electrode 164 is formed by defining the pattern using a positive resist liftoff process. Then 500 angstroms of aluminum are deposited using a room temperature wafer holder and E-beam evaporation. This deposition is followed by an E-beam evaporation deposition of 500 angstroms of gold using a room temperature wafer holder. The excess gold and aluminum are then lifted off by soaking the wafer in hot acetone. The wafer is then rinsed in fresh acetone, methanol and deionized water and dryed in a nitrogen ambient.

Figure 31:
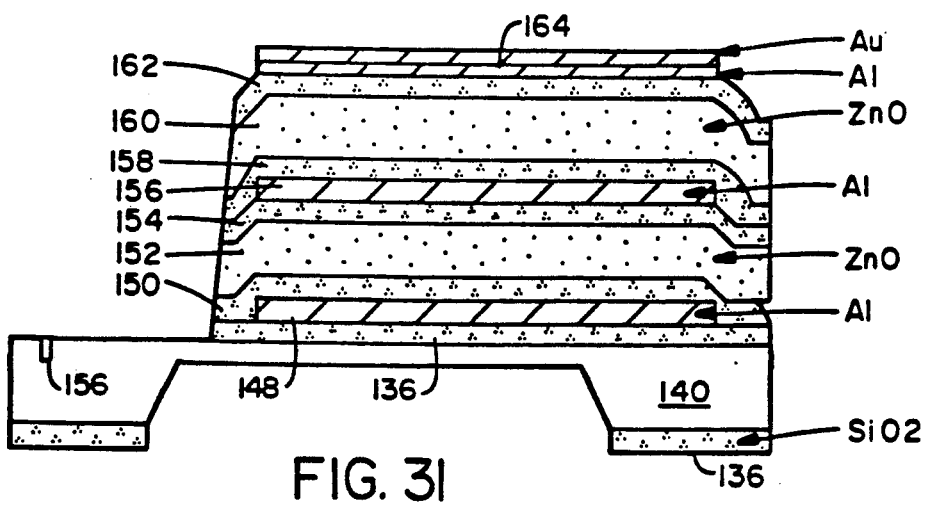

FIG. 31 shows the wafer after the oxides have been patterned. The first step in this process is to sputter deposit 3000 angstroms of titanium/tungsten using an unheated wafer holder. Then the pattern for the oxide is defined in the titanium/tungsten layer which is to be used as an etch mask. This is done by defining the desired pattern in photoresist deposited on the titanium/tungsten and etching the titanium/tungsten layer using 30% $H_2O_2$ for 30 minutes at room temperature. The wafer is then rinsed in deionized water and dryed in a nitrogen ambient. Patterning of the oxides then begins with etching of the top silicon dioxide layer 162 using 6:1 buffered oxide etch, followed by a deionized water rinse. The upper zinc oxide layer 160 is then etched in a solution comprised of: 15 grams of $NaNO_3$, 5 ml $HNO_3$, 600 ml $H_2O$ followed by a deionized water rinse. The middle layer 158 of silicon dioxide is then etched in the same manner as the layer 162, and the bottom layer 152 of zinc oxide is then etched using the same solution makeup as was used to etch the top layer 160. The bottom layer of silicon dioxide 150 is then etched using the same solution makeup used to etch the other layers of silicon dioxide. The wafer is then rinsed in deionized water and dryed. Next, 3 microns of silicon are removed from the top of the wafer in regions where all upper layers have been removed to expose the silicon substrate. This is done using a 1:1 $SF_6:C_2ClF_5$ plasma etch. The wafer is then cleaned and the resist is stripped using acetone, methanol and deionized water. The remaining titanium/tungsten etch mask is then removed in 30% $H_2O_2$ for 30 minutes at room temperature. The wafer is then rinsed in deionized water and dryed.

After the oxide layers are etched, the bonding pad metal is deposited by defining the pattern by a positive photoresist liftoff process. The metal is the deposited using E-beam evaporation of 1 micron of aluminum using a room temperature wafer holder. The excess aluminum is then lifted off by soaking the wafer in hot acetone. The wafer is then rinsed in fresh acetone, methanol and deionized water and dryed.

Next, the wafer side B is scribed using a diamond-tipped saw.

Figure 32:
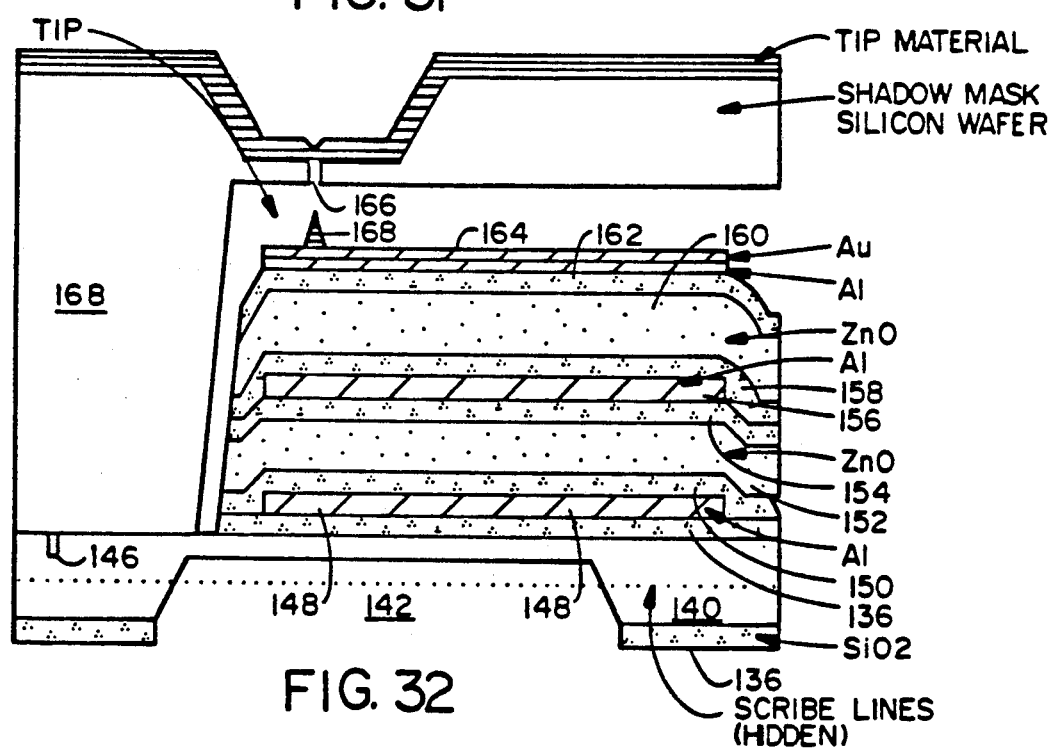

FIG. 32 shows the wafer after the shadow mask for tip formation has been put into place and the tip deposition has taken place. First, the wafer is sputter cleaned for 30 seconds. Then, a separate wafer is fabricated to have the cross section shown in FIG. 32. This wafer has an aperture 166 formed therein and has alignment marks that match the alignment marks 146. The wafer of the shadow mask 168 is then attached to the substrate 140 with alignment marks matched so as to locate the aperture 166 over the desired location on the top electrode 164 for the tip 168. After, the shadow mask is in place, 5–10 microns of the desired tip material, e.g., niobium or tantalum, are deposited through the aperture 166 to form the tip 168. Note, that in the preferred embodiment, the structure of FIG. 32 will be formed at multiple locations on the wafer, and only one shadow mask 168 will be used with multiple apertures at all the desired tip locations for all the cantilevers. Finally, the shadow mask is carefully removed so as to not damage the tips.

Figure 33:
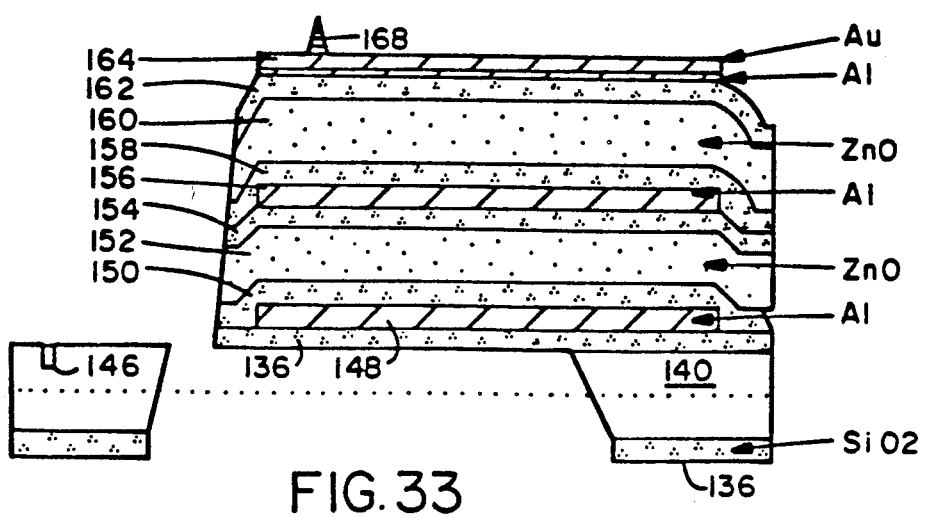

Next, the cantilevers are separated from the substrate along part of their length. FIG. 33 shows the structure after this process has been performed. Separation is accomplished by depositing 10 microns of positive resist on side A of the wafer to protect the structure just described. The wafer is then subjected to a backside etch to etch through the remaining silicon membrane at the bottom of the pit 142 by subjecting side B of the wafer to a 3:1 $SF_6:C_2ClF_5$ plasma etch. The details of this etch are specified in Appendix A. The photoresist is then tripped using acetone, methanol and an air dry cycle. The individual die are then separated by cracking the wafer along the scribe lines.

The presence of the silicon dioxide layer 136 has been found to promote better growth of the aluminum layer 148 which also improves the growth of zinc oxide layers 152 and 160. It also allows conductive paths to be formed beneath the cantilever without being shorted out by the metal of the layer 148. The presence of the silicon dioxide layers 150 and 158 promotes better growth of the zinc oxide layers 152 and 160. The presence of the silicon dioxide layers 154 and 162 aids in balancing stresses in the cantilever which can build up during the deposition processes of forming the cantilever. That is, the same stresses will build up in the silicon dioxide layers 154 and 162 when they are deposited as build up in the silicon dioxide layers 150 and 158 when they are deposited. Accordingly, the stresses are balanced. Also, the silicon dioxide layers separating the pairs of electrodes increases the breakdown voltage. In alternative embodiments, the silicon dioxide layers may be omitted or other materials can be substituted.

The preferred method just described can be used to make either the "one-arm" or bipod type of piezoelectric transducer. The principal difference between these two different structures is in the number of electrode pairs that are formed inside each integrated cantilever. The one arm type of bimorph needs to have at least four pairs of electrodes formed to obtain 3 axis movement. If the one arm type of integrated transducer is to be used for a scanning tunneling microscope, 6 pairs of electrodes must be formed so that electrical connection can be made to the tip and the spurious piezo effects by this tip electrode can be cancelled out. For a two arm bipod type of transducer, only two pairs of electrodes need be formed in each bimorph arm. Obvious modifications to the above described process for the steps of forming the top electrode 148 and the bottom electrode 164 can be made depending upon the type of integrated piezoelectric transducer to be fabricated.

Figure 34A:
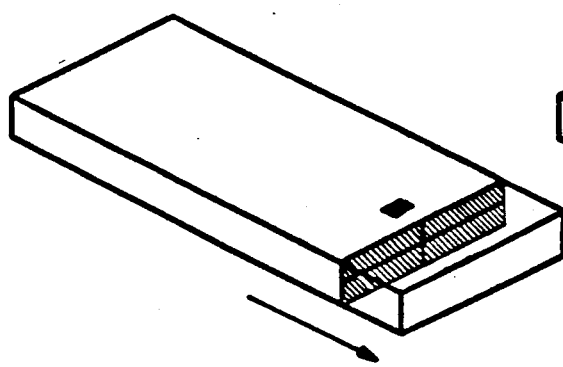
FIGS. 34(a) and (b) through 36(a) and (b) represent the types of X, Y and Z axis motion that can be achieved with single tip bimorphs having the structure shown in cross section in FIG. 10.
Figure 34B:
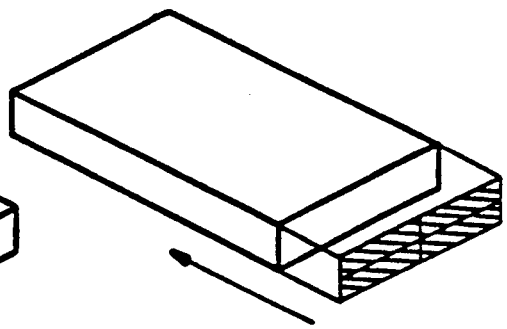
Figure 35A:
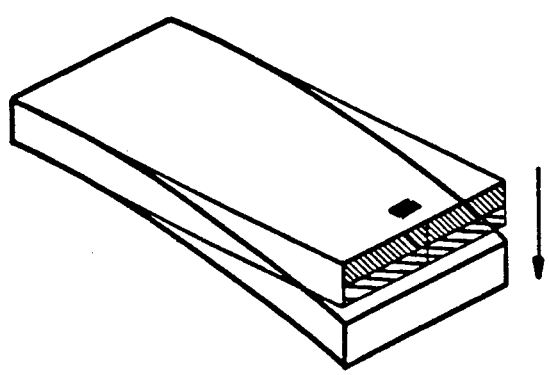
Figure 35B:
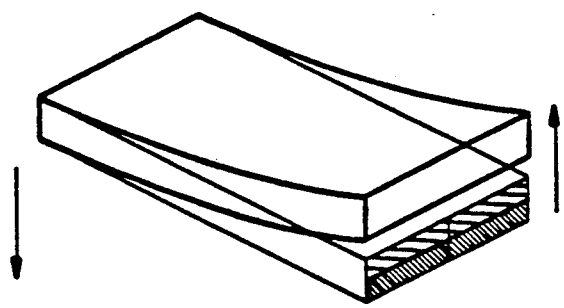

Referring to FIGS. 34(a) and (b) through 36(a) and (b) there are illustrated the movements which may be achieved with a one arm bimorph integrated piezoelectric transducer with the electrode structure shown in FIG. 10. The (a) and (b) illustrations of each figure depict both the positive and negative movements on the associated axis. FIGS. 37(a) and (b) illustrate the type of rotational movement which be achieved for two tip embodiments to have independent Z-axis movement for each tip. The tips move together along the Y and X axes however.

Typical performance parameters are as follows. If a dipod structure is considered with aluminum electrodes one micron thick and zinc oxide layers which are two microns thick, and the legs are each 1000 microns long and 100 microns wide, then the bipod will be able to move the tip 20 angstroms per volt in the X and Y axes and 0.6 microns per volt in the Z axis. The breakdown voltage is 30 volts and the scannable area is 600 angstroms by 600 angstroms or 360,000 square angstroms. If a single arm cantilever bimorph with the same dimensions as given in this paragraph is considered, 200 angstroms per volt of movement in the X axis and 20 angstroms per volt in the Y axis can be achieved. Movement of 0.6 angstroms per volt in the Z axis can be achieved. Thus, the scannable area for the single arm bimorph is 10 times larger than the dipod since the X axis movement is ten times greater per volt. The bimorph design must be such that the tip can be moved within tunneling range of the conductive surface for STM applications.

One purpose of this invention is to reduce the size of the storage unit below that which is possible with magnetic tape storage unit. In a system according to the invention, the storage unit is so small that the entire combination of CCD array, analog-to-digital converters storage unit, and associated control electronics can fit inside of the housing of a 35 mm camera. In effect, we replace the photographic film with a storage unit with sufficient capacity to store multiple images similar to that now being stored on a roll of photographic film. In turn, we play back the images on a convention VCR as an alternative to developing the film as is done in present systems.

Figure 38:
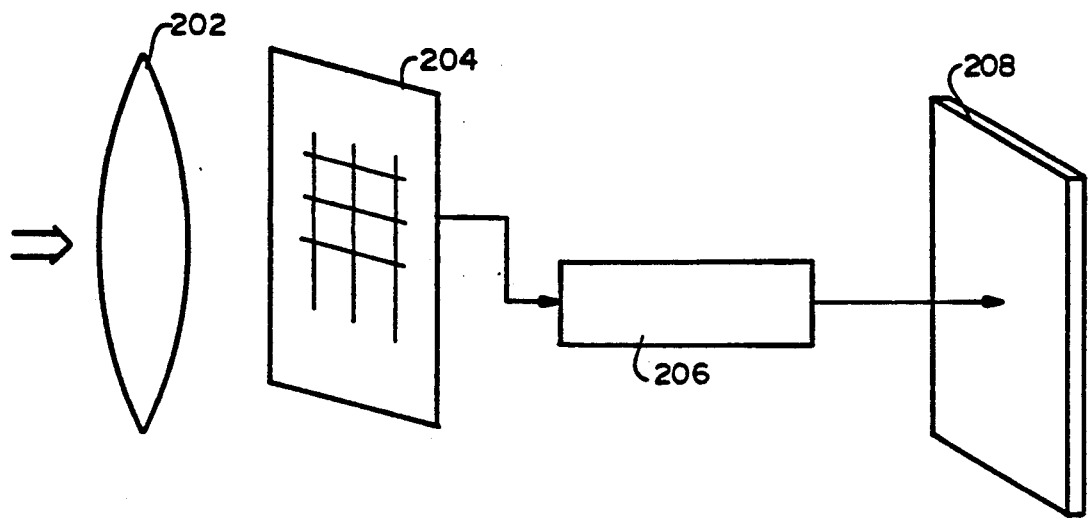
FIG. 38 is a diagrammatic view of an optical imaging storage system.

FIG. 38, in diagrammatic form, shows a system 200 which consists of a conventional lens system 202 for focusing the optical image onto a CCD array 204, the two-dimensional CCD for converting the optical image into linear train of electrical signals, a conventional analog-to-digital converter 206 for converting the electrical signals into a stream of digital pulses, and a storage unit 208.

It is the storage unit which is the novel feature of this invention. We will focus our attention on that component. A digital storage unit of the type that we envision is made possible with the micro-STM—a Scanning Tunneling Microscope miniaturized to the level where it can fit on a singe silicon chip as described hereinabove. We propose to use this device, not for imaging, but for "writing" and "reading" digital information on the surface of a suitable substrate. One bit is stored in an area that measures 10 nanometers on a side. The images that we want to store can be described as a frame of pixels—512×512—with each pixel consisting of 8 bits of information. To store one image we require a storage unit that has the capacity to store 262,144 bytes of information. Each byte consists of 8 bits and we, therefore, need to store 2,097,152 bits. This requires that we have the capacity to store a square array with 1,448 bits on each side, that is, approximately 1,500 bits on a side. The bits are placed 10 nm on centers and this means a square array of 1,500 bits requires an area 15 microns×15 microns. This area is considerably smaller than the size of the silicon chip used for the micro-STM, which measures 2 mm on a side. It follows that one micron-STM could be used to write and read one optical image. A 5×5 element array of micro-STM's is used to store 25 images—a number that is not too different from what is on an ordinary roll of film. Our storage unit consists of an array of STM's on a common substrate which measures typically 1 cm. in diameter.

The physical mechanism for storing digital information on the substrate may take on a variety of forms. All of these are now under development in research laboratories. All use the STM or AFM to write and read. These include the following:

(1) Storage of trapped charge in thin dielectric films analogous to the storage mechanism used in conventional semiconducting memories.
(2) Storage of information in the form of micro-domains in magnetic films where the information is read with a spin dependent tunneling.
(3) Writing by deposition of atomic species on the substrate in a manner controlled by the tip. This takes a variety of forms such as:
  a) deposition from an organo-metallic vapor where the energy for decomposing the vapor comes from the tunneling electrons;
  b) electroplating a small area using the electric field of the tip to plate ions onto a suitable substrate from an electrolyte;
  c) deposition or polymerization-in-place of a suitable vapor such as with phenyl;

d) development of a thin photoresist such as PMMA with the electrons from a tip;
e) manipulation of single atoms on a Germanium substrate;
f) direct marking, or deformation, of a gold surface where the STM is immersed in an insulating oil or grease to allow the tip voltage to be 3 volts which is sufficiently intense to create a mark on the gold surface so that the mark can be read by scanning the area with a much reduced voltage on the tip.

An Atomic Force Microscope—as constructed with the same technology that is used to construct the micro-STM—is also used to create and subsequently read micro domains in magnetic substrates.

Figure 39:
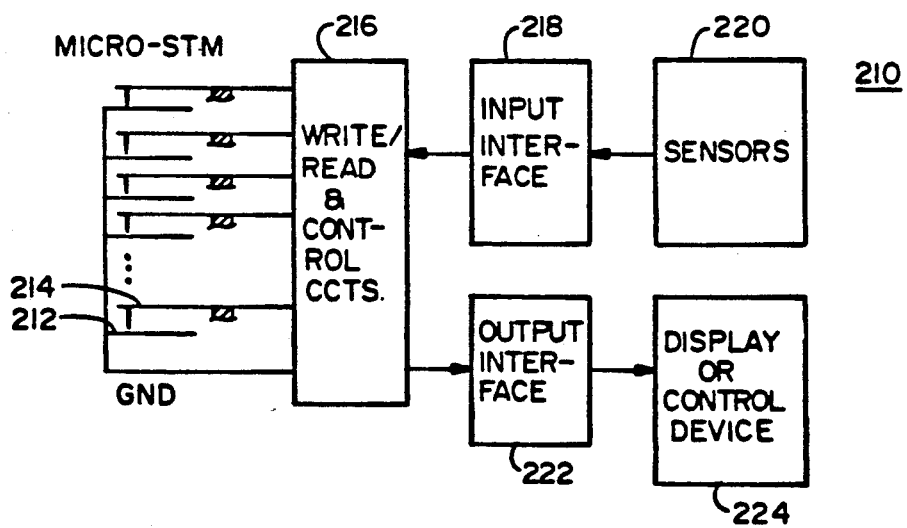
FIG. 39 is a block diagram of a system which uses a number of piezoelectric bimorph cantilevers for writing and reading information to and from recording surfaces.

FIG. 39 shows a system 210 which includes a number of recording surfaces (typically shown as 212) and a number of piezoelectric bimorph cantilevers (typically shown as 214) forming blocks of memory, or information storage, devices. A control subsystem 216 includes circuits for controlling the position of the tips of the cantilever arms as it scans the surface of a recording surface. In addition, circuits are provided for writing and reading information to and from the recording surfaces. Information is inputed through an input interface circuit 218 from sensor devices 220. The sensors include, for example, charge control devices (CCD). The input interface circuit 218 includes an analog-to-digital converter for converting the analog CCD output signals to a digital format. An output interface circuit 222 is provided for digital-to-analog conversion of stored digital signals to formats suitable for display or for control of another device.

Figure 40:
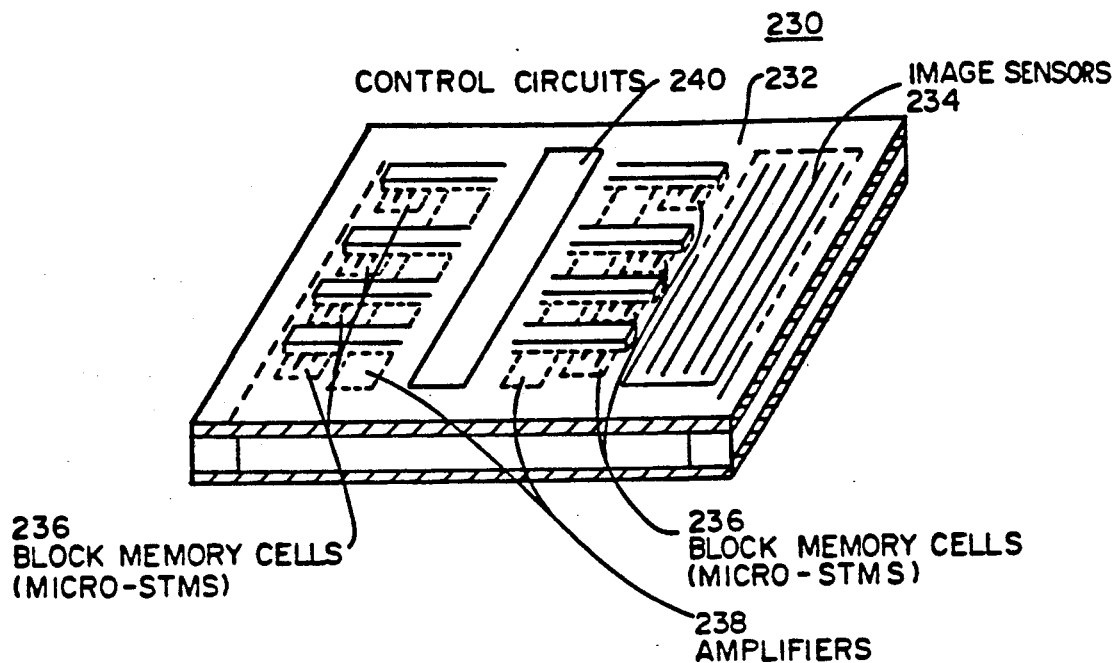
FIG. 40 is a perspective view of a substrate on which are formed by semiconductor integrated circuit techniques the imaging sensors and various components of a bimorph-cantilever and recording-surface memory system.

FIG. 40 shows an embodiment of an imaging system 230 mounted on substrate 232 which is, for example, a silicon substrate. Image sensors 234 are formed on the substrate. A number of block memory cells 236 formed from microminiature scanning tunneling microscopes are arranged in parallel rows on the substrate. Associated with each set of memory cells are amplifier (typically shown as 238). Control circuits 240 are provided on the same substrate for controlling of read/write operation and for scanning of the cantilever tips over the memory surfaces.

Figure 41:
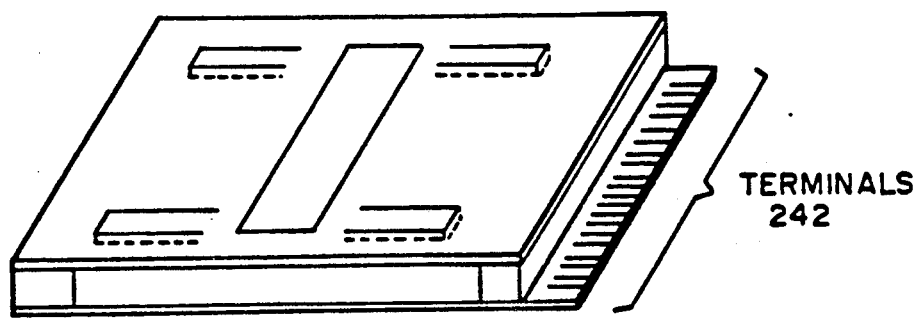
FIG. 41 is a perspective view of a substrate having input/output terminals connected thereto.

FIG. 41 shows an embodiment of a system in which the components are mounted or formed in a single substrate. Various terminals 242 are provided for providing input and output information from and to, respectively, for example, the sensors 220 and display or control devices 224 of FIG. 39.

Although the invention has been described in terms of the preferred and alternative embodiments detailed herein, those skilled in the art will appreciate many modifications which may be made without departing from the spirit and scope of the invention. All such modifications are intended to be included within the scope of the claims appended hereto.

APPENDIX A

Preferred Planar STM Process

1. Deposition of mask materials
   1a. Clean 380 μm thick (100) wafer using standard acid clean***
   1b. Thermally grow 5000Å $SiO_2$
   1c. Deposit 100Å $Si_3M_4$ using LPCVD
2. Etch KOH pits from backside (rough surface, side B)
   2a. Using mask #1 and negative photoresist, define KOH squares
   2b. Oxygen plasma* for 1 min to 'Descum' openings
   2c. Etch $Si_3N_4$ using $SF_6$ and F13B1 (1:1) plasma etch
   2d. Etch $SiO_2$ layer using 6:1 buffered Oxide Etch (BOE)
   2e. Strip photoresist and clean wafer**
   2e. Etch 340 μm of silicon from backside using 30& KOH at 80° C.
   2f. Rinse wafer using 10:1 $H_2O$:HCl solution
   2g. Rinse in de-ionized water (DI) then dry in $N_2$
3. Etch Alignment marks on frontside (polished side, side A)
   3a. Using mask #2 and positive resist, define alignment marks
   3b. Oxygen plasma* for 1 min to 'Descum' opeinings
   3c. Etch $Si_3N_4$ using $SF_6$ and F13B1 (1:1) plasma* etch
   3d. Etch $SiO_2$ layer using 6:1 buffered Oxide Etch (BOE)
   3e. Rinse in DI then dry in $N_2$
   3f. Etch 3 μm of Si using 1:1 $SF_6$:$C_2ClF_5$ plasma etch
   3g. Clean wafer using standard acid clean (strip resist)**
   3h. Strip $Si_3N_4$ using concentrated $H_3PO_4$ @ 165° C. for 1 hr
   3i. Rinse in DI then dry in $N_2$
4. Deposit bottom electrodes
   4a. Define pattern w/mask #3, positive resist and liftoff process
   4b. E-beam evaporate 1000Å Al using room temp. wafer holder
   4c. "Liftoff" excess Al by soaking wafer in hot Acetone
   4d. Rinse wafer in fresh Acetone, Methanol, and DI, then dry in $N_2$
5. Deposit lower oxides
   5a. Sputter clean surface, 30 sec
   5b. E-beam evaporate 1000Å $SiO_2$ substrate is heated to 200° C.
   5c. Sputter deposit 2 μm ZnO using Zn target in 5:1 $O_2$:Ar gas, 30 m Torr. Substrate held to 300° C.
   5d. E-beam evaporate 1000Å $SiO_2$ is heated to 200° C.
6. Deposit middle electrodes
   6a. Define pattern w/mask #4, positive resist and liftoff process
   6b. E-beam evaporate 1000Å Al using cold wafer holder
   6c. "Liftoff" excess Al by soaking wafer in hot Acetone
   6d. Rinse wafer in fresh Acetone, Methanol, and DI, then dry in $N_2$
7. Deposit upper oxides
   7a. Sputter clean surface, 30 sec
   7b. E-beam evaporate 1000Å $SiO_2$ substrate is held to 200° C.
   7c. Sputter deposit 2 μm ZnO using Zn target in 5:1 $O_2$:Ar gas, 30 m Torr. Substrate held to 300° C.
   7d. E-beam evaporate 1000Å $SiO_2$ is held to 200° C.
8. Deposit Top electrodes

APPENDIX A-continued
Preferred Planar STM Process

- 8a. Define pattern w/mask #5, positive resist and liftoff process
- 8b. E-beam evaporate 500Å Al using room temp. wafer holder
- 8c. E-beam evaporate 500Å Au (Gold) using room temp. wafer holder
- 8d. "Liftoff" excess Al and Au by soaking wafer in hot Acetone
- 8e. Rinse wafer in fresh Acetone, Methanol, and DI, then dry in $N_2$
9. Pattern ZnO
    - 9a. Sputter deposit 3000Å Ti/W using room temp. wafer holder
    - 9b. Define pattern w/mask #6, positive resist
    - 9c. Pattern Ti/W using 30% $H_2O_2$, 30 min @ room temp.
    - 9d. Rinse in DI then dry in $N_2$
    - 9e. Etch top layer $SiO_2$ using 6:1 BOE (1 min), Rinse in DI
    - 9f. Etch upper ZnO in following solution: 15 g NaNO3, 5 ml HNO3, 600 ml $H_2O$, Rinse in DI
    - 9g. Etch middle layer $SiO_2$ using 6:1 BOE (2 min), Rinse in DI
    - 9h. Etch lower ZnO in following solution: 15 g NaNO3, 5 ml HNO3, 600 ml $H_2O$, Rinse in DI
    - 9i. Etch bottom layer $SiO_2$ using 6:1 BOE (1 min),
    - 9j. Rinse in DI then dry in $N_2$
    - 9k. Etch 3 μm of Si using 1:1 $SF_6C_2ClF_5$ plasma etch
    - 9l. Clean wafer, strip resist using Acetone, Methanol, and DI
    - 9m. Strip Ti/W in 30% $H_2O_2$ (30 min @ room temp.)
    - 9n. Rinse in DI then dry in $N_2$
10. Deposit bonding pad metal
    - 10a. Define pattern w/mask #7, positive resist and liftoff process
    - 10b. E-Beam evaporate 1.0 μm Al using room temp. wafer holder
    - 10c. "Liftoff" excess by Al soaking wafer in hot Acetone
    - 10d. Rinse wafer in fresh Acetone, Methanolm and DI then dry in $N_2$
11. Scribe wafer on Side B using saw
12. Deposit Tips
    - 12a. Sputter clean surface for 30 seconds
    - 12b. Place shadow mask on top of wafer, align to pattern using 'key' formed with Al/ZnO/Al/ZnO/Au pattern
    - 12c. Deposit 5-10 μm Niobium, forming pointed tips
    - 12d. Carefully remove shadow mask, avoid damaging tips
13. Separate cantilevers from substrate
    - 13a. Deposit 10 μm layer positive resit on Side A
    - 13b. Etch through Si membrane from sibe B using 3:1 $SF_6:C_2ClF_5$ Plasma* etch
    - 13c. Strip photoresist in Acetone & Methanol, air dry
14. Separate dies (or 'chips') by cracking wafer along scibe lines

*All plasma etches are performed using Power = 500 W at 200 mTorr pressure for 6 min, unless otherwise stated
**Standard clean for removing negative photoresist
**a. Agitate vigorously in 120° C. 10:1 $H_2SO_4:H_2O_2$ for 20 min
**b. Rinse in DI
**c. Soak in 4:1:1 $H_2O:H_2SO_4:H_2O_2$ at 90° C. for 20 min
**d. Rinse in DI then dry in $N_2$
***Standard Pre-Oxidation Clean
***a. Perform above clean (*Standard clean for removing negative photoresist)
***b. Soak in 10:1:1 $H_2O:HCl:H_2O_2$ at 90° C. for 20 min
***c. Rinse in DI
***d. Soak in 10:1:1 $H_2O:NH_4OH:H_2O_2$ at 90° C. for 20 min
***e. Rinse in DI
***f. Dip in 50:1 BOE for 30 sec at 23° C. (ambient)
***g. Rinse in DI then dry in $N_2$

We claim:

1. An integrated memory device, comprising:
   a substrate;
   a recording surface having a recording medium associated therewith for storing information at various locations on said recording surface, said recording surface fixed with respect to said substrate;
   a piezoelectric bimorph cantilever attached to said substrate at one end and having a free end with a tip fixed thereto, said bimorph cantilever including two layers of piezoelectric material sandwiched between multiple pairs of electrodes in such a manner that three axis movement of said bimorph cantilever is caused by applying suitable potentials to said multiple pairs of electrodes; and
   control means coupled to said multiple pairs of electrodes of the piezoelectric bimorph cantilever, for adjusting the potentials applied between those pairs of electrodes so as to scan said tip over the recording surface to access the various locations on said recording surface.

2. The memory device of claim 1 wherein said recording surface includes a thin dielectric film for storing trapped charge.

3. The memory device of claim 1 wherein said recording surface includes magnetic films for storing information.

4. The memory device of claim 1 wherein said recording surface and said piezoelectric bimorph cantilever operate as a scanning tunneling microscope.

5. The memory device of claim 1 wherein said recording surface and said piezoelectric bimorph cantilever operate as an atomic force microscope.

6. The memory device of claim 1 including a plurality of recording surfaces, each having a piezoelectric bimorph cantilever associated therewith.

7. A memory device for writing in or reading out information, comprising:
   a piezoelectric bimorph cantilever having a tip, said piezoelectric bimorph cantilever including two layers of piezoelectric material sandwiched between multiple pairs of electrodes in such a manner that three axis movement of said piezoelectric bimorph cantilever is caused by applying suitable potentials to said multiple pairs of electrodes;

a memory surface for storing information at a plurality of storage locations on said memory surface; wherein said piezoelectric bimorph cantilever and said memory surface form an integrated device with said piezoelectric bimorph cantilever mounted at a fixed position relative to said memory surface;

control means coupled to said multiple pairs of electrodes of the piezoelectric bimorph cantilever, for adjusting the potentials applied between those pairs of electrodes so as to scan the tip of said piezoelectric bimorph cantilever over the memory surface to align said tip with each of said storage locations on said memory surface;

means coupled to said piezoelectric bimorph cantilever's tip for writing information in each of said storage locations; and means coupled to said piezoelectric bimorph cantilever's tip for reading out information stored in each of said storage locations.

8. The memory device of claim 7 wherein said means for writing information includes means for operating said piezoelectric bimorph cantilever and said memory surface as a scanning tunneling microscope.

9. The memory device of claim 7 wherein the means for reading information and the means for writing information are coupled, respectively, to input terminals and output terminals.

10. A memory device, comprising:
a piezoelectric bimorph cantilever having a tip, said piezoelectric bimorph cantilever including two layers of piezoelectric material sandwiched between multiple pairs of electrodes in such a manner that three axis movement of said piezoelectric bimorph cantilever is caused by applying suitable potentials to said multiple pairs of electrodes;

a memory surface for storing information at a plurality of storage locations on said memory surface; wherein said piezoelectric bimorph cantilever and said memory surface form an integrated device with said piezoelectric bimorph cantilever mounted at a fixed position relative to said memory surface;

control means coupled to said multiple pairs of electrodes of the piezoelectric bimorph cantilever, for adjusting the potentials applied between those pairs of electrodes so as to scan the tip of said piezoelectric bimorph cantilever over the memory surface to align said tip with each of said storage locations on said memory surface; and means coupled to said piezoelectric bimorph cantilever's tip for reading out information stored in each of said storage locations.

11. The memory device of claim 10, including means for operating said piezoelectric bimorph cantilever and said memory surface as a scanning tunneling microscope.

12. A memory device, comprising:
a piezoelectric bimorph cantilever having a tip, said piezoelectric bimorph cantilever including two layers of piezoelectric material sandwiched between multiple pairs of electrodes in such a manner that three axis movement of said piezoelectric bimorph cantilever is caused by applying suitable potentials to said multiple pairs of electrodes;

a memory surface for storing information at a plurality of storage locations on said memory surface; wherein said memory surface and said piezoelectric bimorph cantilever are mounted on a common substrate;

control means coupled to said multiple pairs of electrodes of the piezoelectric bimorph cantilever, for adjusting the potentials applied between those pairs of electrodes so as to scan the tip of said piezoelectric bimorph cantilever over the memory surface to align said tip with each of said storage locations on said memory surface; and means coupled to said piezoelectric bimorph cantilever's tip for reading out information stored in each of said storage locations.

13. The memory device of claim 12, including means coupled to said piezoelectric bimorph cantilever's tip for writing information in each of said storage locations, said means for writing information including means, located on said common substrate, for providing said information to said means for writing information.

14. The memory device of claim 13 wherein said means for providing information includes means for sensing images.

* * * * *